United States Patent [19]

Koch et al.

[11] Patent Number: 5,288,659
[45] Date of Patent: Feb. 22, 1994

[54] PHOTONIC-INTEGRATED-CIRCUIT FABRICATION PROCESS

[75] Inventors: Thomas L. Koch, Holmdel; Uziel Koren, Fair Haven, both of N.J.

[73] Assignee: AT&T Bell Laboratories, Murray Hill, N.J.

[21] Appl. No.: 944,628

[22] Filed: Sep. 14, 1992

Related U.S. Application Data

[63] Continuation of Ser. No. 237,251, Aug. 18, 1988, Pat. No. 5,147,825.

[51] Int. Cl.$^5$ .................. H01L 21/308; H01S 3/18
[52] U.S. Cl. ................... 437/129; 372/45; 148/DIG. 95; 148/DIG. 106; 437/133
[58] Field of Search .............. 437/81, 99, 105, 107, 437/110, 108, 126, 129, 133, 225, 228, 936, 939, 945, 976; 148/DIG. 95, DIG. 106; 156/662; 372/45, 46, 50, 96

[56] References Cited

U.S. PATENT DOCUMENTS

| | | | |
|---|---|---|---|
| 4,575,851 | 3/1986 | Seki et al. | 372/45 |
| 4,622,674 | 11/1986 | Mito | 372/45 |
| 4,665,528 | 5/1987 | Chinone et al. | 372/96 |
| 4,759,023 | 7/1988 | Yamaguchi | 372/26 |
| 4,820,655 | 4/1989 | Noda et al. | 437/129 |
| 5,147,825 | 9/1992 | Koch et al. | 437/228 |

FOREIGN PATENT DOCUMENTS

| | | |
|---|---|---|
| 59-229889 | 12/1984 | Japan . |
| 61-260696 | 11/1986 | Japan . |
| 62-296588 | 12/1987 | Japan . |
| 63-114190 | 5/1988 | Japan . |

OTHER PUBLICATIONS

Asada et al., "Gain and Intervalence Band Absorption in Quantum-Well Lasers", IEEE Journal of Quantum Electronics, vol. QE-20, No. 7, Jul. 1984, pp. 745-753.
Koch et al, "Nature of Wavelength Chirping in Directly Modulated Semiconductor Lasers" Electronics Letters, 6th Dec. 1984, vol. 20, No. 25/26, pp. 1038-1039.
Miller et al., "Planar Buried Heterostructure InP/Gal- nAs Lasers Grown Entirely by OMVPE", Electronics Letters, vol. 22, No. 18, pp. 947-949.
Harder et al., "Measurement of the Linewidth Enhancement Factor & of Semiconductor Lasers", Appl. Phys. Lett., vol. 42, No. 4, 15 Feb. 1983, pp. 328-330.
Agrawal et al, "Linewidth of Distributed Feedback Semiconductor Lasers with Partially Reflecting Facets", Appl. Phys. Lett., vol. 48, pp. 457-459, 1986.
Kogelnick et al., "Coupled-Wave Theory of Distributed Feedback Lasers", J. Appl. Phys. vol. 43, No. 5, May 1972, pp. 2327-2335.
Kotaki et al., "1.55 $\mu$m Wavelength Tunable FBH-DRB Laser", Electronics Letters, 26th Mar. 1987, vol. 23, No. 7, pp. 325-327.
Koren et al., "Quantum Well Laser", Appl. Phys. Lett., vol. 51, No. 21, 23 Nov. 1987, pp. 1744-1745.
Tsang et al., "High-Speed Direct Single-Frequency Modulation with Large Tuning Rate and Frequency Excursion in Cleared-Coupled-Cavity Semiconductor Lasers", Appl. Phys. Lett., vol. 42, No. 8, 15 Apr. 1983, pp. 650-652.
Koren et al., "Semi-Insulating Blocked Planar BH GaInAsP/InP Laser with High Power And High Modula-
(List continued on next page.)

Primary Examiner—Mary Wilczewski
Attorney, Agent, or Firm—Gregory C. Ranieri

[57] ABSTRACT

An improved process for fabricating photonic circuits is disclosed. The inventive process starts with a growth of a base wafer comprising a stack of epitaxial layers of various materials. At least a portion of each of the material layers will ultimately be a functioning part of any of a number of devices which will form the PIC or will serve a role in at least one of the fabrication processing steps. Specific inventive processing steps are addressed to (1) interconnecting passive waveguides, active devices, and grating filtering regions without the substantial optical discontinuities which appear in the prior art, and (2) etching continuous waveguide mesas to different depths in different regions of the PIC so as to optimize the performance of each PIC device.

5 Claims, 27 Drawing Sheets

OTHER PUBLICATIONS tion Bandwidth", Electronics Letters, vol. 24, No. 3, 4th Feb. 1988, pp. 138-140.

Matsuoka et al, "Verification of the Light Phase Effect at the Facet on DFB Laser Properties", IEEE Journal of Quantum Electronics, vol. QE-21, No. 12, Dec. 1985, pp. 1880-1886.

Murata et al., "Over 720 GHz (5.8 nm) Frequency Tuning by a 1.5 μm DBR Laser With Phase and Bragg Wavelength Control Regions", Electronics Letters, 9th Apr. 1987, vol. 23, No. 8, pp. 403-405.

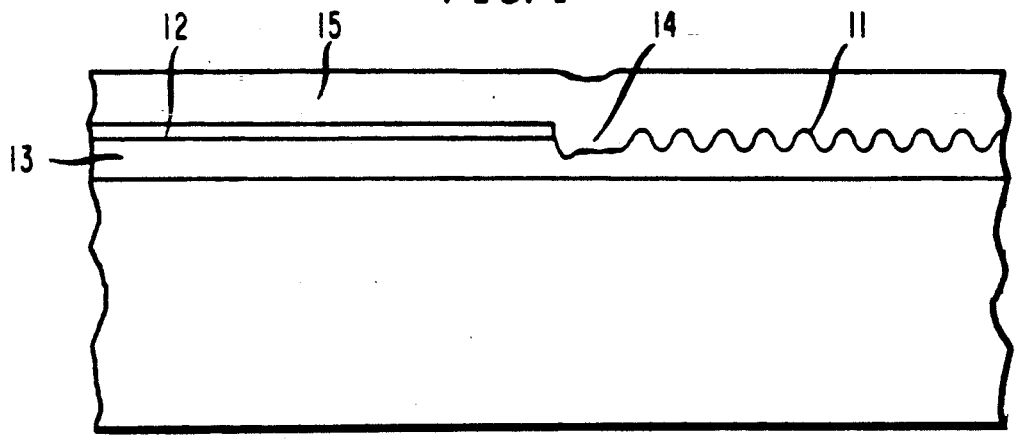
PRIOR ART FIG. 1
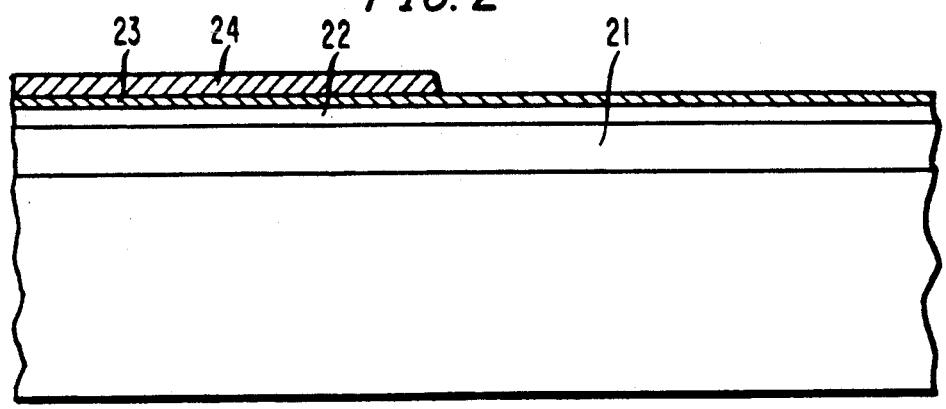
PRIOR ART FIG. 2
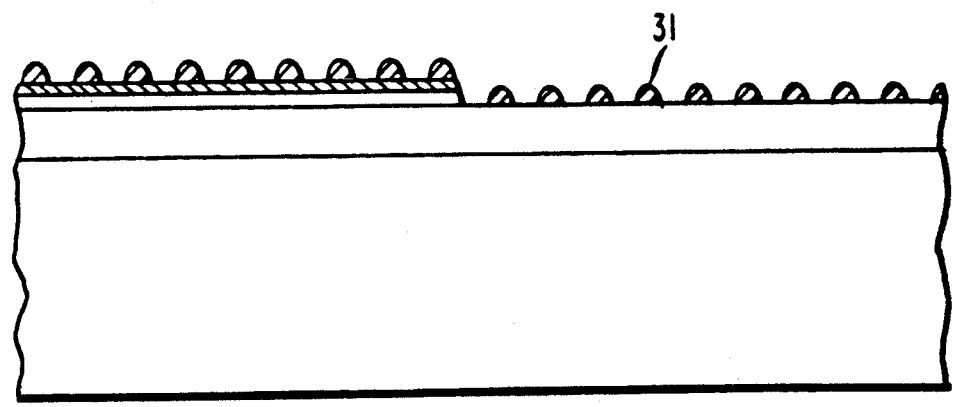
PRIOR ART FIG. 3

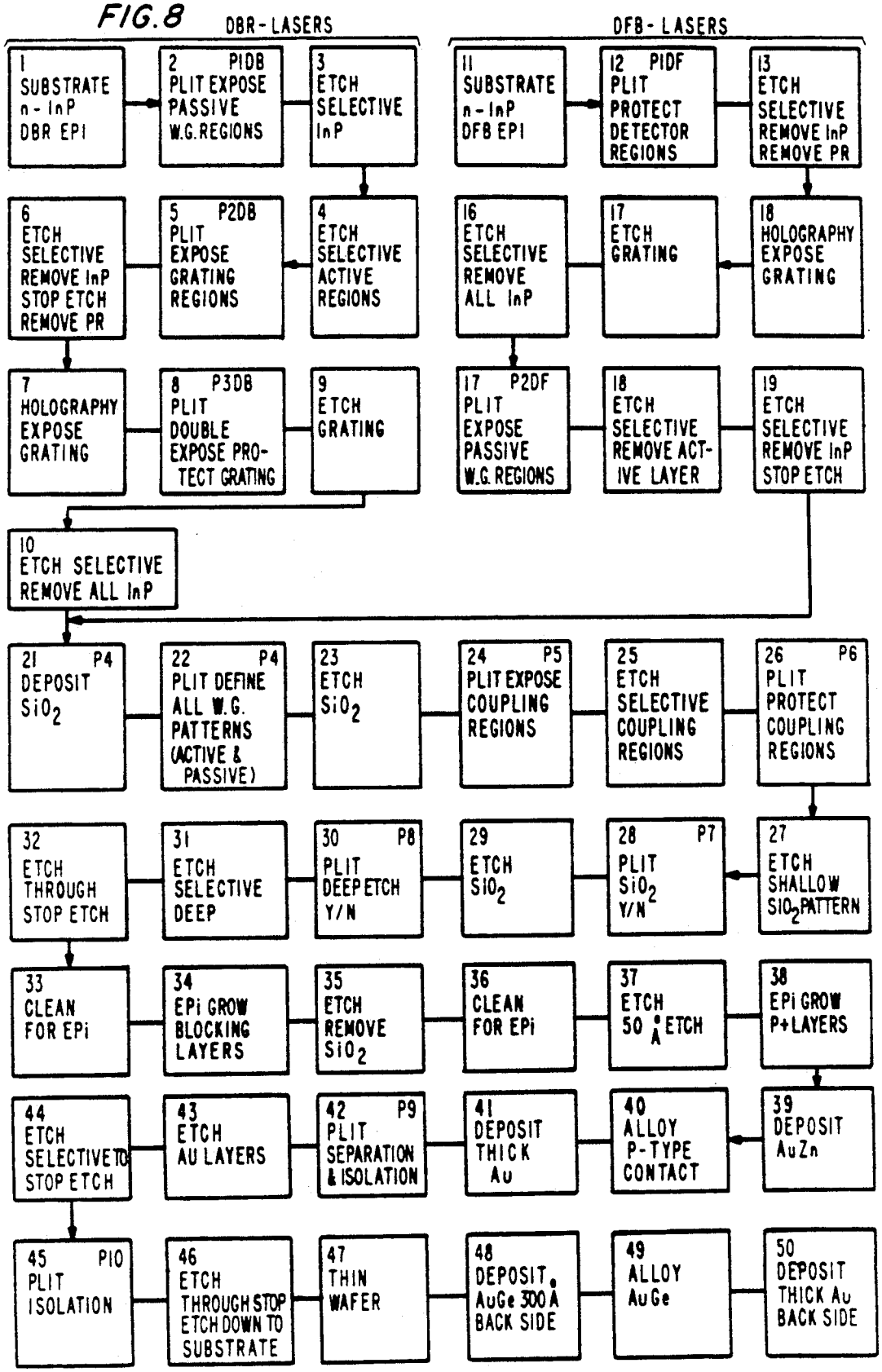

5,288,659

PHOTONIC-INTEGRATED-CIRCUIT FABRICATION PROCESS

This is a continuation of application Ser. No. 07/237,251 filed Aug. 18, 1988, now U.S. Pat. No. 5,147,825.

TECHNICAL FIELD

This invention involves photonic integrated circuits (PICs) and processes for fabricating such PICs.

BACKGROUND OF THE INVENTION

The invention of the optical fiber, and subsequent developments which resulted in economical processes for manufacturing such fiber, has given birth to the field of optical communications. Currently, this field is essentially limited to transmission of information in optical form. However, the processing of information still proceeds by way of electrical devices and methods. Consequently, information signals must be processed in electrical form, transformed to optical form for transmission, and then retransformed to electrical form for further processing after the optical signals are received. Clearly, the economics of optical communications will drive the industry to develop optical devices capable of processing information in optical form. Such devices would include, for example, lasers, amplifiers, detectors, couplers, modulators, and regenerators, all coupled by appropriate optical waveguides. Such devices can be fabricated today, however, generally, they can only be manufactured in discreet form, and in order to be economically viable for optical communications systems, such devices would have to be manufactured in integrated form. However, to date, suggested processing techniques for fabricating PICs are not yet sufficiently effective or flexible to be economically viable for use in commercial optical communications.

SUMMARY OF THE INVENTION

This invention is an improved process for fabricating Photonic Integrated Circuits (PICs). The inventive process starts with the growth of a "base wafer", i.e., stack of epitaxial layers of various materials on an appropriate substrate. At least a portion of each of the material layers will ultimately be either a functioning part of any of a number of devices which will form the PIC or will serve a role in at least one of the fabrication processing steps. Specific inventive processing steps are addressed to (1) interconnecting passive waveguides, active devices, and grating filtering regions without the substantial optical discontinuities which appear in the prior art, and (2) etching continuous waveguide mesas to different depths in different regions of the PIC so as to optimize the performance of each PIC device. The inventive process results in, for example, (a) high definition patterning of waveguides in shallow mesa regions, (b) the ability to make buried waveguides at angles substantially different from the conventional crystallographic orientations, (c) improved coupling between waveguides in different regions of the PIC, (d) effective, low-parasitic-capacitance current confinement in deep mesa regions, and (e) low loss passive waveguides. A specific embodiment of the invention which combines both current confinement in deep mesa regions and low loss passive waveguides in shallow mesa regions involves the formation of low loss passive waveguides in which upper cladding layers are comprised of low doped or semi-insulating material with low optical absorption. In this embodiment that same low-doped or semi-insulating material simultaneously acts as an electrical blocking layer for the deep mesa regions of the PIC.

BRIEF DESCRIPTION OF THE DRAWING

FIG. 1 is a schematic representation of a prior art device involving a selective area grating.

FIG. 2 is a schematic representation of a base wafer used to fabricate the prior art device of FIG. 1.

FIG. 3 is a schematic representation of a corrugated resist mask placed on the structure of FIG. 2 in order to etch a corrugation in the semiconductor surface.

FIG. 8 is an exemplary flow description of the inventive process.

DETAILED DESCRIPTION

Figure 4:
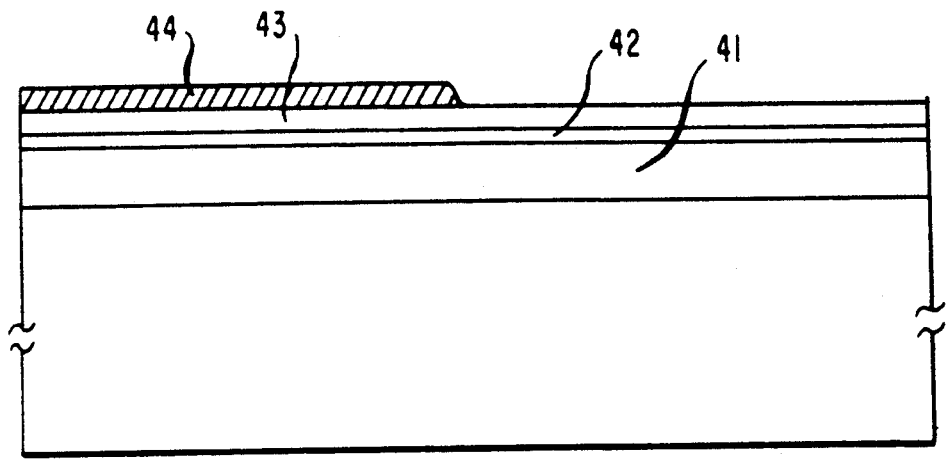
FIG. 4 is a schematic representation of a base wafer used in an embodiment of the inventive process.

1. General Description of Aspects of the Invention

A. Selective Area Grating Fabrication

Large numbers of photonic devices involve the use of gratings. For example, the distributed feedback laser (DFB) and other DFB devices, and the distributed Bragg reflector (DBR), and other DBR devices utilize grating regions as an integral part of the device. Often these devices will include optical waveguides, and in many such devices the grating portion of the device will be limited in physical extent. Fabrication of such limited grating areas using prior art techniques has often resulted in unacceptable waveguide or optical discontinuities. In other devices involving gratings, prior art fabrication techniques necessitate the deleterious removal of essential layers in the device in regions where the grating will not ultimately appear. The present invention permits the fabrication of selective area gratings without these deleterious effects. The unique ability of the inventive technique to fabricate such areas will now be discussed in detail with reference to FIGS. 1 and 2.

FIG. 1 is a schematic representation (not to scale) of a prior art device involving a selective area grating 11. In this FIG., 12 may be an exemplary active or gain layer in a laser or amplifying structure. 13 is a waveguiding layer intended to be largely continuous over some extended portion of the device. (In this and other of the schematic drawings portions of the device unnecessary for the immediate discussion at hand are not shown.) In the prior art, the device shown in FIG. 1 may be fabricated by first growing a number of epitaxial layers on a suitable substrate, followed by deposition of a suitable masking dielectric 23, as shown in FIG. 2. In this figure, 22 is a layer, a portion of which will ultimately provide the gain area 12 as shown in FIG. 1. In FIG. 2, 21 is the layer which will ultimately form the waveguiding region 13 in FIG. 1. 23 is the dielectric masking layer. Using standard photolithography procedures, photoresist is deposited and patterned to leave a protective resist mask 24, as shown in FIG. 2, over the region where no grating is desired. The dielectric layer is then patterned with standard etching techniques to cover the limited region of the structure shown as 12 in FIG. 1. Layer 22 is then removed with suitable selective etchants over only the exposed portion of the device. This is followed by the application of a photoresist, holographic exposure, and developing to form a corrugated resist mask 31 suitable for etching a corrugation in the semiconductor surface as shown in FIG. 3. Due to the remaining dielectric layer, this corrugation will only be etched into the exposed region 11 in FIG. 1. Following the grating formation, the dielectric mask is removed and the structure is then overgrown with a suitable cladding layer 15 as shown in FIG. 1. In this prior art technique, it is found that an over-etched region, 14 in FIG. 1, appears which results in undesirable optical discontinuity in the waveguide layer, 13, as shown, and poor device performance.

We believe that the reason for this over etching may be explained as follows. During the etching step, active etching will only take place in region 11 of FIG. 1 but not in region 12 where the dielectric will remain. Accordingly, the etchant over area 11 will slowly become at least somewhat depleted while the etchant over area 12 will remain substantially at full strength, since no etching takes place in area 12. Consequently, the region 14, which is closest to this undepleted etchant bath which appears over area 12, will be more strongly etched than other portions of region 11 over which there will be at least a somewhat depleted etchant bath.

The inventive process avoids this over etching by eliminating the use of a dielectric mask during the corrugation etch, and providing instead a material over region 12 whose function will at least include providing material for the bath to etch so that the etchant bath will be approximately uniformly depleted along the entire length of the device. While this additional layer is being etched, it still provides protection, as the dielectric did in the prior art, for the underlying layers. We find that using this technique, the over etching phenomenon is eliminated to the extent of our observational capabilities. The resulting degree of optical continuity along the waveguide has led to substantial improvements in device performance as disclosed in greater detail in the discussion of the embodiment below.

The inventive process is shown schematically in FIGS. 4–7. FIG. 4 shows the initial structure, analogous to FIG. 2, where a resist mask 44 has already been patterned with standard photolithographic techniques. In FIG. 4, layer 43 is now a material which will etch, during the corrugation etching step, at a rate comparable to the etch rate for layer 41, for example, an appropriate epitaxially grown semiconductor layer.

Again referring to FIG. 4, using the resist mask, or any other suitable mask, layers 42 and 43 are removed in the exposed regions with suitable material selective etchants. Then, just as in the prior art, a corrugated resist mask is formed with holographic exposure, for example, to leave the configuration shown in FIG. 5. The corrugation is then uniformly transferred into the structure with a suitable etchant to form the structure of FIG. 6. It is at this step that the overetching at the boundary between the two regions is avoided. Corrugated layer 62 is then removed with a suitable material selective etchant, and the structure may then be overgrown to yield the final desired structure of FIG. 7. The removal of the corrugated layer 62 may not be required when the following overgrown layer will be of similar composition or optical properties.

This discussion has been in terms of a device where the grating appears adjacent to a portion of the waveguide over which there are additional functioning layers, such as the region 12 in FIG. 1. In other applications, it may be desirable to juxtapose the grating adjacent to a portion of the waveguide over which there is no additional functioning layer. This can still be accomplished with the inventive processing technique by utilizing an additional, but photolithographic, exposure, following the holographic exposure to completely remove the resist grating mask over the region adjacent to the grating region. Therefore, during the grating etching step, this adjacent region is uniformly etched to leave a smooth surface with no corrugation. A typical resultant device is disclosed in further detail in our discussion of embodiment C below.

The use of a masking material which etches at a rate comparable to the unprotected, etched, region has been disclosed in the context of grating fabrication. However, we have also found it useful for uniform (non-corrugated) etching in selective areas when a non-material-selective etching is used and the same over-etching phenomenon shown in FIG. 1 as 14 might occur. An exemplary sequence of masking and etching steps in such an embodiment of this invention would be the same as shown in FIGS. 4-7 except the grating mask shown in FIG. 5 would be omitted. In this embodiment regions 61 and 62 in FIG. 6 would then be uniformly etched rather than corrugated. (The term corrugation as used here is meant to broadly indicate regions of varying depth, such variations occurring in a substantially uniform pattern. Exemplary of such corrugations or uniformly patterned regions is the grating used in DBR and DFB devices as shown, for example, in the FIGS. 7, 10, 11, 15, and 22. It will of course be understood that the depth of the variations in the uniform pattern may vary depending upon the particular application and may be vanishingly small for certain applications. In such applications, the "uniform pattern" then becomes a substantially level surface. The term "uniform pattern" as used here includes such level surfaces.)

B. Selective Area Mesa Etching in Combination With The Use of Semi-Insulating Layers For Blocking and Cladding An aspect of the invention involves the formation of mesa waveguides which are etched to different depths in different regions of the PIC. This selective area etching to form mesas at different depths in different regions of the PIC is effected through the use of multiple etch steps, each of which may be followed by a selective masking step that masks appropriate portions of the PIC from subsequent etching. Additionally, the original stack of material layers may include numerous stop etch layers which allow predetermination of the specific etch depths with a high degree of precision determined by the thickness accuracy of the original epitaxial growth technique. This aspect of the invention is disclosed in further detail in our discussion of those embodiments of the invention which involve A Distributed Feedback Laser with Y-Branching Waveguide etc.

2. Specific Description of the Inventive Process

An exemplary process flow description for the inventive processing technique is given in FIG. 8. At the beginning of the process there are two parallel paths corresponding to which type of lasers (DBR's or DFB's) are to be used. If there are only active devices that do not require gratings (such as optical amplifiers or Fabry-Perot lasers) then the simpler DBR path may be followed and the grating and holographic steps 5 through 9 may be skipped.

There is another important option that is allowed in the inventive processing technique which is the incorporation (or exclusion) of conventional directional couplers in the device. In the coupling region of a directional coupler it may be desirable that the waveguide region should only be partially etched between the two guides so that a large coupling coefficient can be obtained. This requires the addition of two Plit mask levels (steps no. 24 and 26). Also, the base wafer must include an additional InP stop etch layer to stop the partial waveguide etch of step 25. If, however, this form of directional couplers are not included then steps 24 through 26 may be skipped.

Figure 5:
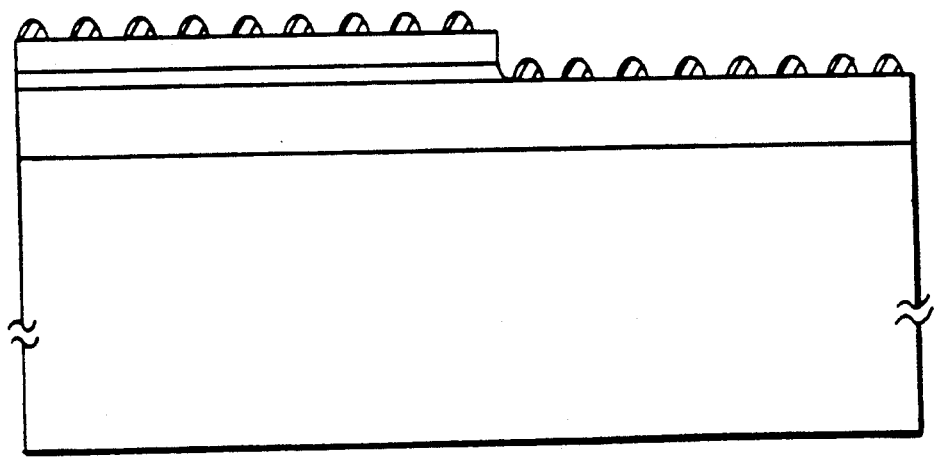
FIG. 5 is a schematic representation of the base wafer of FIG. 4 with a corrugated resist mask.
Figure 6:
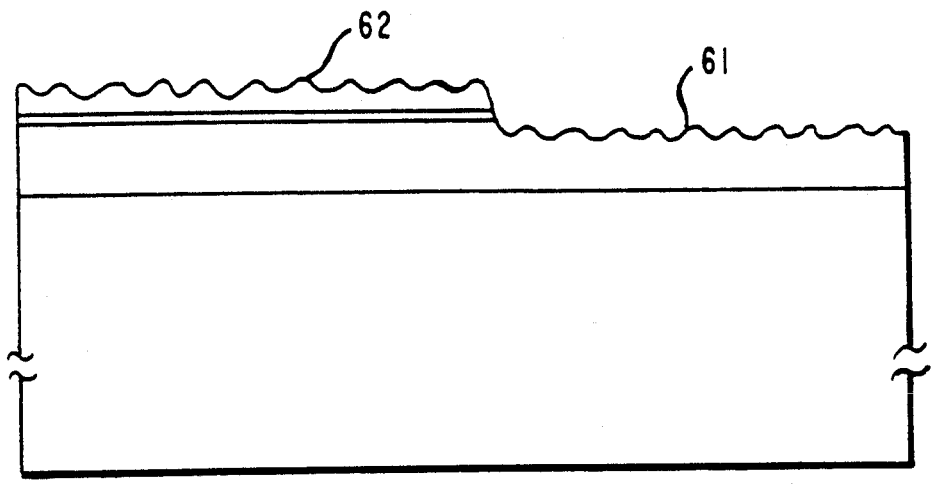
FIG. 6 is a schematic representation of the structure of FIG. 5 subsequent to etching.
Figure 7:
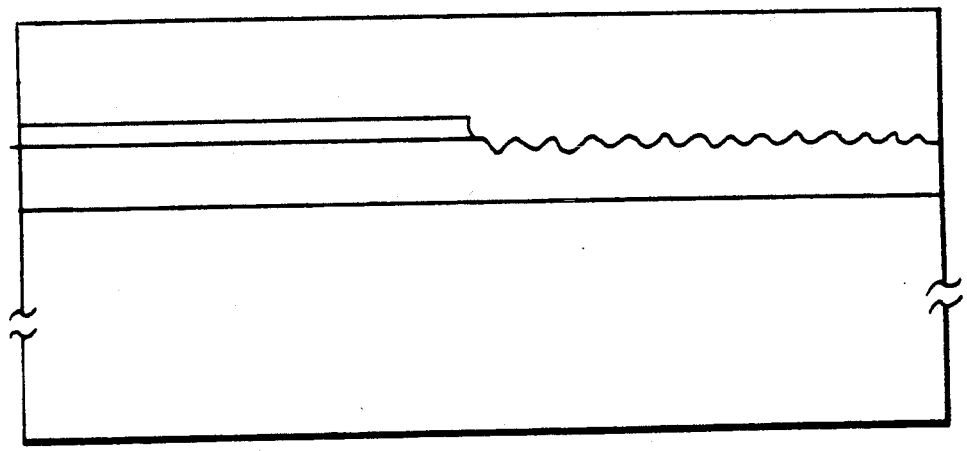
FIG. 7 is a schematic representation of the structure of FIG. 6 in which the corrugated layer is removed and the structure is overgrown.
Figure 9A:
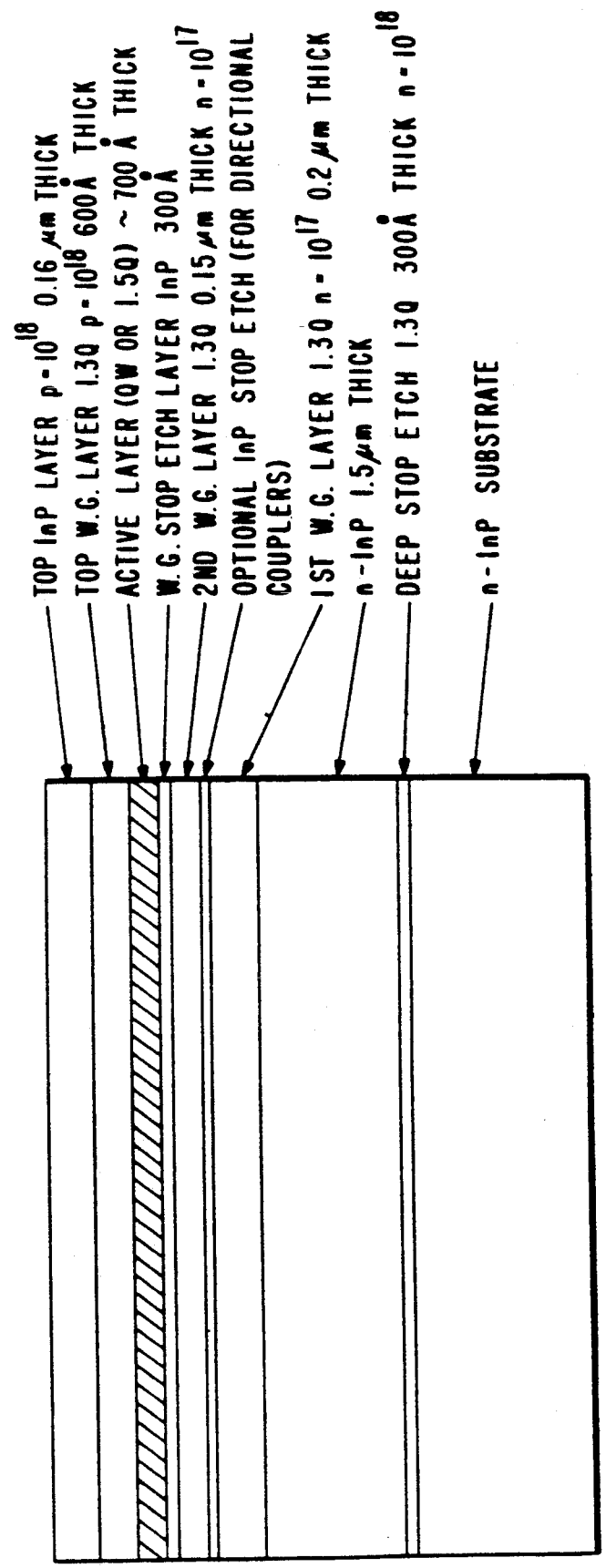
FIG. 9a is a schematic diagram of a base wafer used in the inventive process to fabricate PICs with DBR lasers.
Figure 9B:
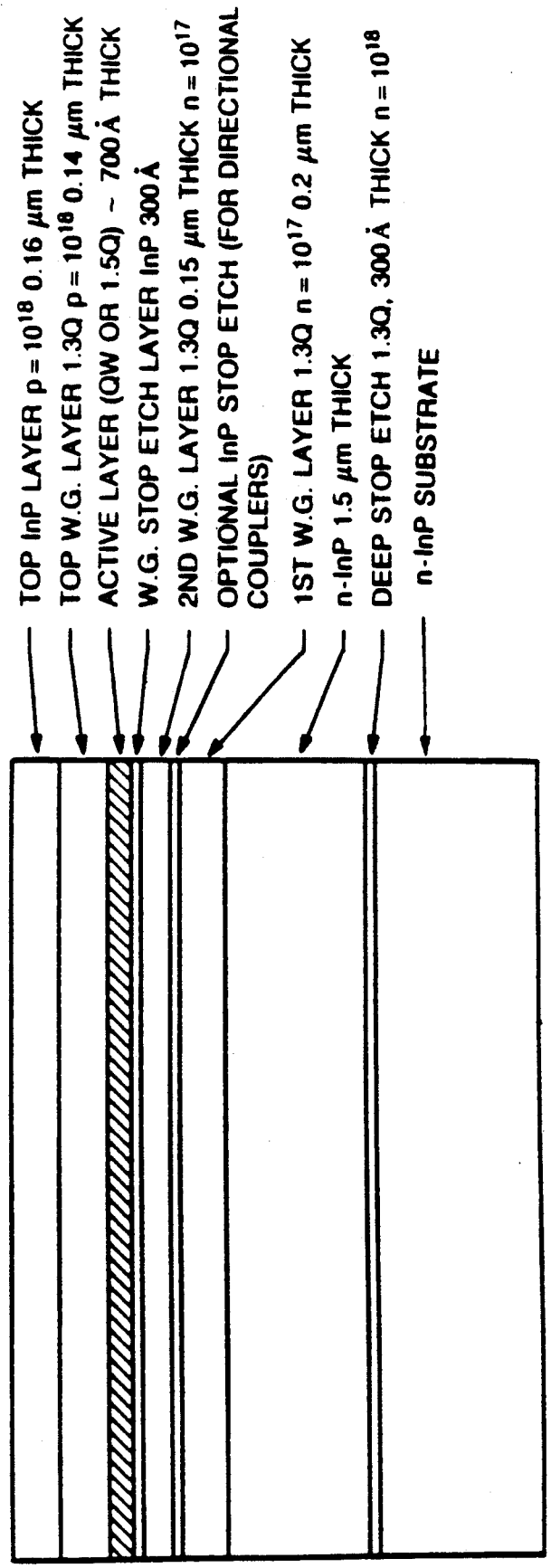
FIG. 9b is a schematic diagram of a base wafer used in the inventive process to fabricate PICs with DFB lasers.

The first step of the process (step 1 or 11) is to grow the epitaxial base wafer on an n-type InP substrate. The layer scheme of the base wafer for each one of the options of the inventive processing technique is shown in FIG. 5, 9a and 9b.

The next group of steps are related to grating fabrication. Gratings are usually made over the whole wafer. However, where gratings are not required a dummy InP layer is left on which the gratings are made but then are removed by selective etching with a following step (e.g., step 10 or 16). In steps 5-8 an exposed waveguide layer is subdivided into regions with and without gratings. This is done by a holographic exposure over the whole wafer followed by a regular Plit step (with the same photoresist) which exposes the regions where gratings are not required. The result is that the gratings are etched only where required during the grating etch step (no. 9) while the rest of the waveguide regions undergo a slight uniform etch which mostly removes the InP stop etch layer.

There is one Plit level for the removal of the active layer from regions used for passive waveguides. This is done at step 2 or 17 for the DBR or DFB options respectively.

The two process paths merge at step 21 which is followed by the definition of the actual waveguide pattern of the device (steps 22-23) with a generally complex SiO₂ stripe mask pattern.

Steps 24-26 are optional for directional couplers. These steps are followed by an overall shallow etch, using the SiO₂ mask, which just goes through the active and waveguide layers everywhere across the wafer. This is followed by two important Plit levels (steps 28 and 30).

In step 28 we remove the SiO₂ from the passive waveguide sections (sections that do not require carrier injection or electrical fields). This will cause the epitaxial blocking layers of step 34 to grow directly on top of these sections and thus buffer the waveguide from the epitaxial p-type layers of step 38. In step 30 we divide the waveguide pattern to regions where we maintain the shallow etch or continue with a deep etch down to the bottom stop etch layer (see FIG. 9). A deep etch is usually required for current confinement in laser or amplifier sections and for low capacitance elements. A shallow etch is preferred for long passive waveguide sections with y branches, bends, etc.

The last steps (39 through end) are designed for electrical contact formation and for electrical isolation between the various elements of the PIC. Two steps (42, 45) are allowed for isolation. The first is an etch that stops short (using a stop etch layer) of the waveguide layer (as we do not want to disconnect the elements optically) and is called separation. The other step is a deeper etch going down to the substrate. This step offers a much larger isolation since any leakage path through the etch will consist of two diodes back-to-back. This isolation etch can be performed in regions where there are no waveguide interconnections.

Unlike the Silicon IC's process where the design rules result only from technological limitations, here, the design rules follow from the optical properties of waveguides and the physical properties of the III-V materials.

The single mode BH waveguide is typically 1.5 micron wide. As there is some undercut associated with many the inventive processing technique steps (such as Plit, SiO₂ etch, shallow etch, etc.) the p4-level waveguide mask of step 22 (see FIG. 8) usually will have line width of 4.5 microns with plus or minus 0.5 micron precision. There is also another important consideration involving the critical p4 level mask, i.e., the waveguide for all active elements such as lasers, amplifiers, directional couplers and detectors (elements that require deep etch) will run in the same direction. This direction will then be aligned with the 011 direction of the crystal. The passive waveguide sections, however, can deviate to within 2.5 degrees from this direction thus allowing y-branches interconnections, etc. but these sections will usually be used with shallow etch (step 30) and no SiO₂ at step 28.

The other Plit levels typically define regions of several hundreds of microns in dimension. These regions can be conveniently (but not necessarily) defined with wide stripes lying in the 011 bar direction.

3. Specific Embodiments of the Invention

A. Distributed Feedback Laser with a Y-Branching Waveguide

When a semiconductor laser is used in optical fiber communication systems, the frontface output power is monitored by a backface output detector. This method, conventionally used for a Fabry-Perot laser, can not be applied to a DFB laser because the outputs from the two sides of a DFB laser with randomly cleaved facets can differ by a factor as large as two (T. Matsuoka, Y. Yoshikuni and H. Nagai, IEEE J. Quantum Electron., QE-21, 1880 (1985) and G. P. Agrawal, N. K. Dutta, and P. J. Anthony, Appl. Phys. Lett., 48, 457 (1986)) and the ratio may change as the laser degrades. This DFB frontface-backface mistracking problem is caused by a phase effect between grating reflections and facet reflections. This effect varies the external differential efficiency. In addition, when one facet of a DFB laser is destroyed to suppress the Fabry-Perot resonances, the outputs from the two sides are completely different. To solve this problem, a frontface detector is integrated in this embodiment. Furthermore, the two-mode degeneracy of an axially symmetric DFB laser (H. Kogelnik and C. V. Shank, J. Appl. Phys. 43, 2327 (1972)) is removed with the asymmetric reflectivity configuration of the integrated DFB laser, resulting in stabilized single DFB mode oscillation.

Figure 10:
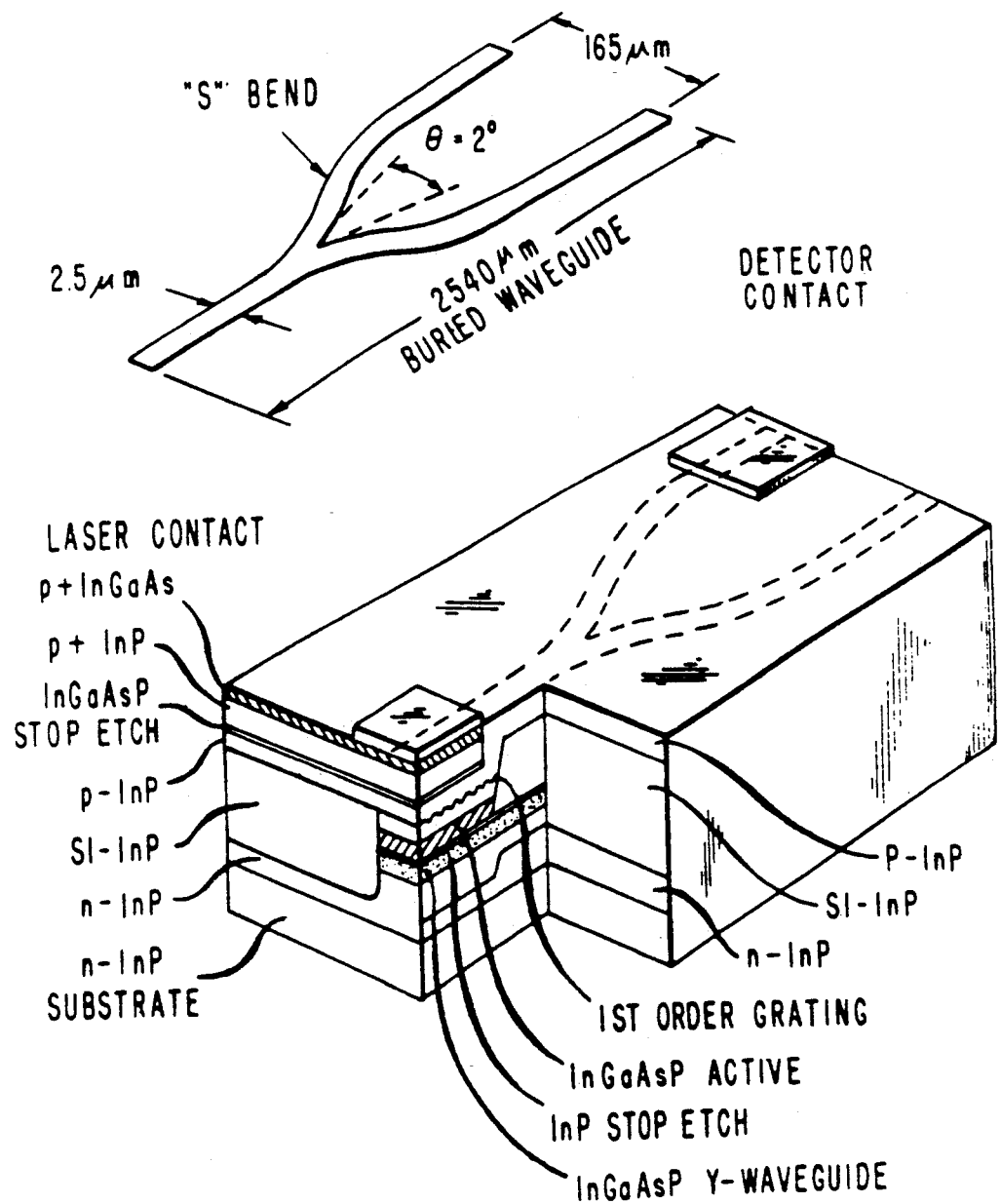
FIG. 10 is a schematic diagram of the DFB-Y-detector PIC fabricated with the inventive process. The location of the buried waveguide (dotted region) is shown projected on the top surface.
Figure 11:
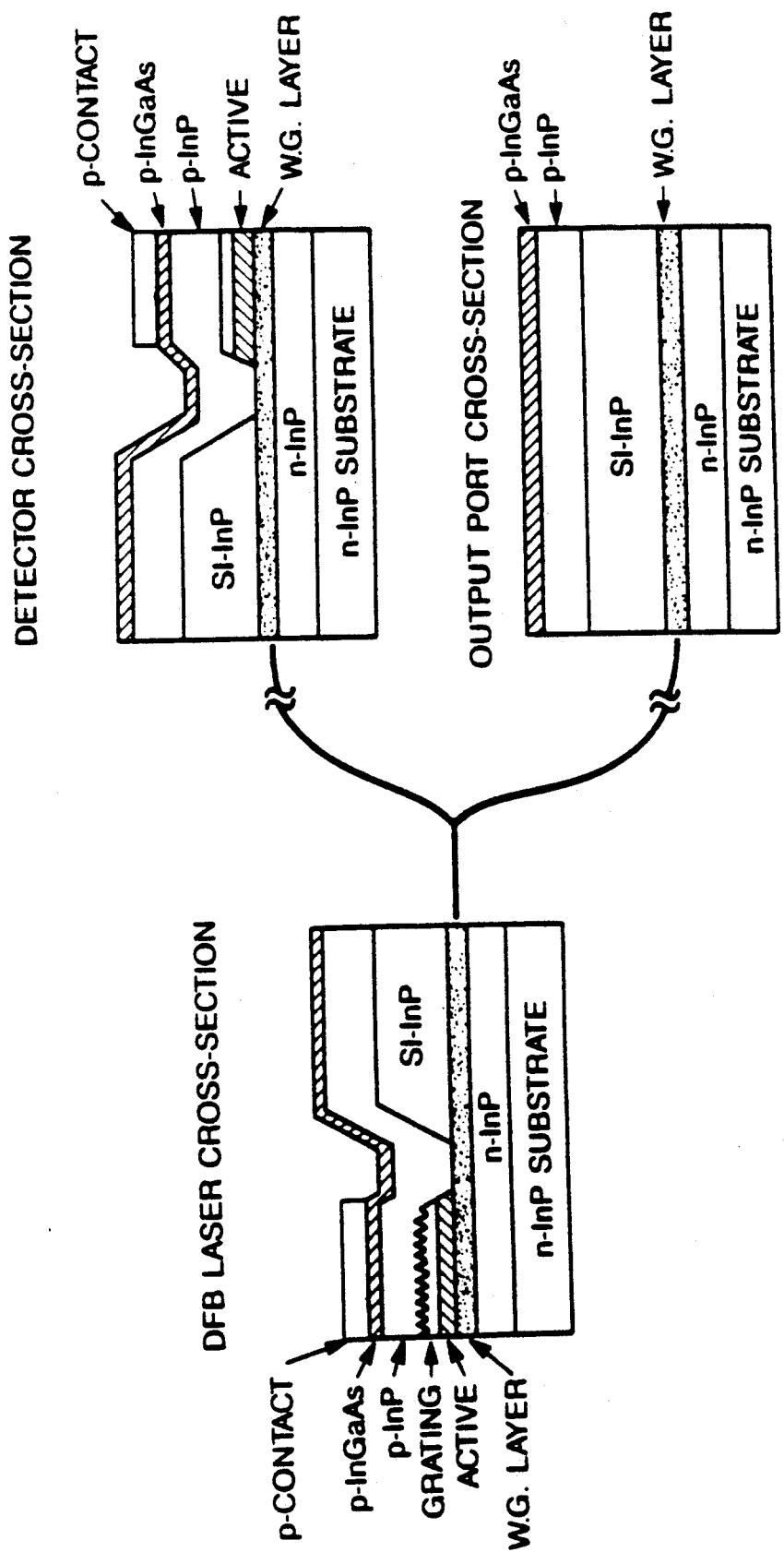
FIG. 11 is a longitudinal cross section of the laser end, the detector end, and the waveguide output port of the device of FIG. 10.

The DFB-Y-Detector PIC is shown schematically in FIG. 10. The laser is a semi-insulating planar buried heterostructure (SIPBH) type (B. I. Miller, U. Koren, and R. J. Capik, Electron. Lett. 22, 947 (1986)) with a first-order grating. The emission wavelength is near 1.5 $\mu$m. The laser oscillates in the fundamental mode, which is coupled to the adjacent 1.3-$\mu$m passive waveguide layer, and the output is guided by the Y-branching waveguide. A symmetrical Y-junction is integrated as a 3-dB power divider. "S" shaped bends are employed to reduce the bending loss. The branching angle between the two tangent lines at the splitting point is 2°. One of the two branches is used as the output port and the other is coupled to an integrated p-i-n detector. The same laser structure without the grating is used for the detector. FIG. 11 shows the details of longitudinal cross-sections of the laser and the output ends. The 200 Å thick stop-etch layers, which are important for PIC processing but have insignificant effect on wave-guiding, are not shown in FIG. 11. Both the laser and the detector are 250 $\mu$m long and the total length of the PIC is 2540 $\mu$m.

The PIC fabrication involves the following steps. First, seven layers are grown by MOCVD on an n-InP substrate. These layers are a 200 Å thick InGaAsP stop-etch layer, a 1.6 $\mu$m thick n-InP cladding layer, a 2700 Å InGaAsP ($\lambda \sim 1.3$ $\mu$m) passive waveguide layer, a 200 Å InP stop-etch layer, a 1000 Å undoped InGaAsP ($\lambda \sim 1.5$ $\mu$m) active layer, a 1500 Å InGaAsP ($\lambda \sim 1.3$ $\mu$m) waveguide layer, and a 1200 Å p-InP layer. The top p-InP layer, except for the detector areas, is then removed by wet chemical etching. Then, a first-order holographic grating is produced everywhere on the wafer. By selectively etching away the p-InP layer on the detector areas and then etching off the InGaAsP layers on top of the InP stop-etch layer in the passive waveguide areas, the grating is left only on the laser areas while the active layer is left on both the laser and detector areas. The Y-waveguide mesa is etched using an SiO₂ mask with the straight sections parallel to the (011) orientation, followed by an MOCVD regrowth of Fe-doped SI (semi-insulating) InP layer for current blocking. It is important to note that a shallow etch is done for the passive waveguide and a deep etch for the laser and detector. Also, the SiO₂ mask is removed from the region of the passive waveguide before the regrowth. Therefore, after the regrowth, the long passive waveguide is buried in the low-loss SI-InP layer, as illustrated in FIGS. 10 and 11. This is followed by removal of the remaining SiO$_2$ mask, and then a second MOCVD regrowth of a p-InP layer, an InGaAsP stop-etch layer, a p+InP layer, and a p+ InGaAs cap layer. The stop-etch layer is used to remove part of the conducting p-layers to increase the electrical isolation between the laser and the detector. Finally, standard metallization is applied to the lasers and detectors for electrical contacts. The PIC chips are cleaved from the wafer and are mounted p-side up on copper studs.

Figure 12:
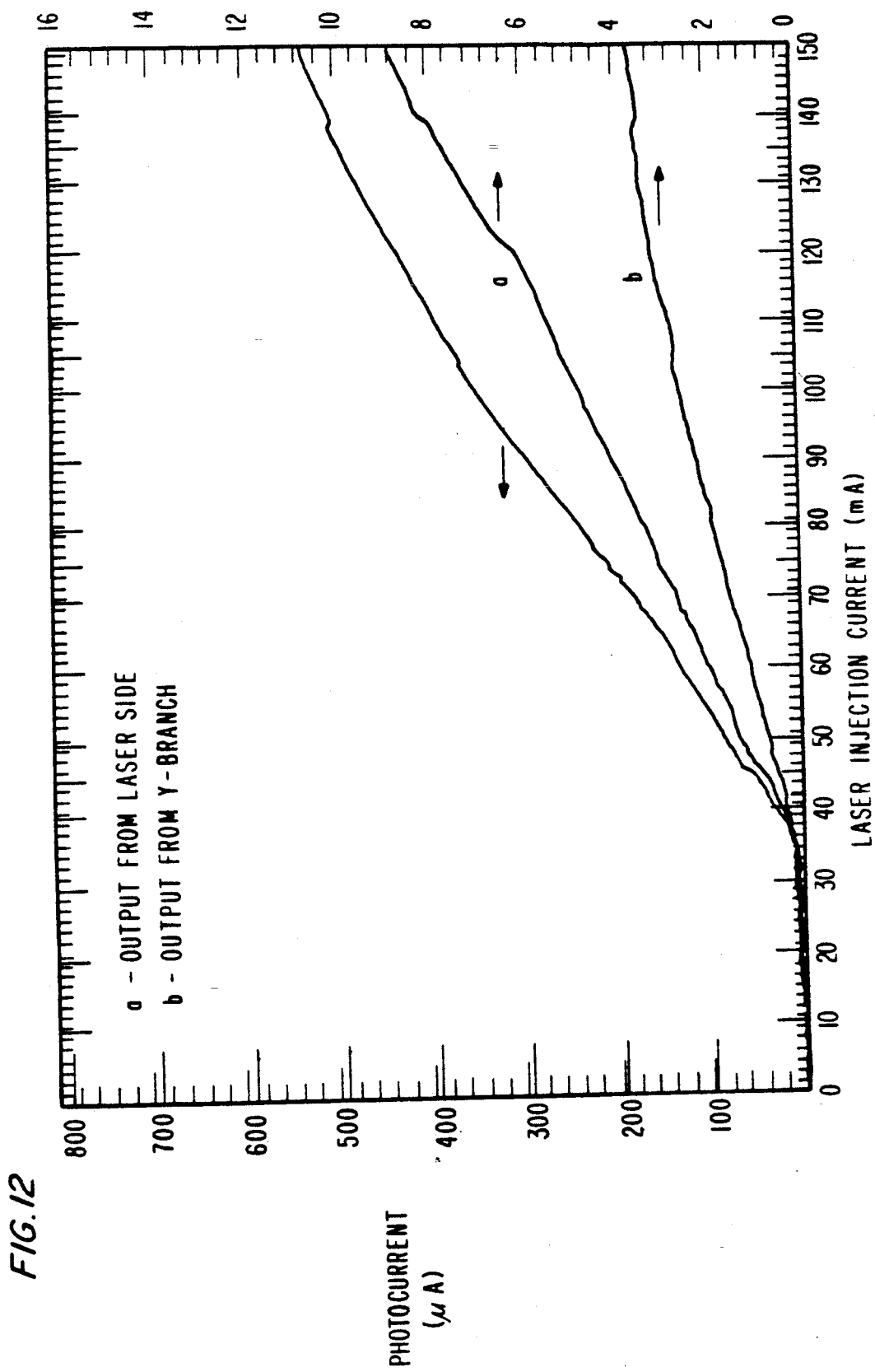
FIG. 12 is a representation of the detector photocurrent versus laser injection current for a device of FIG. 10 at a temperature of 25 degrees C.
Figure 13:
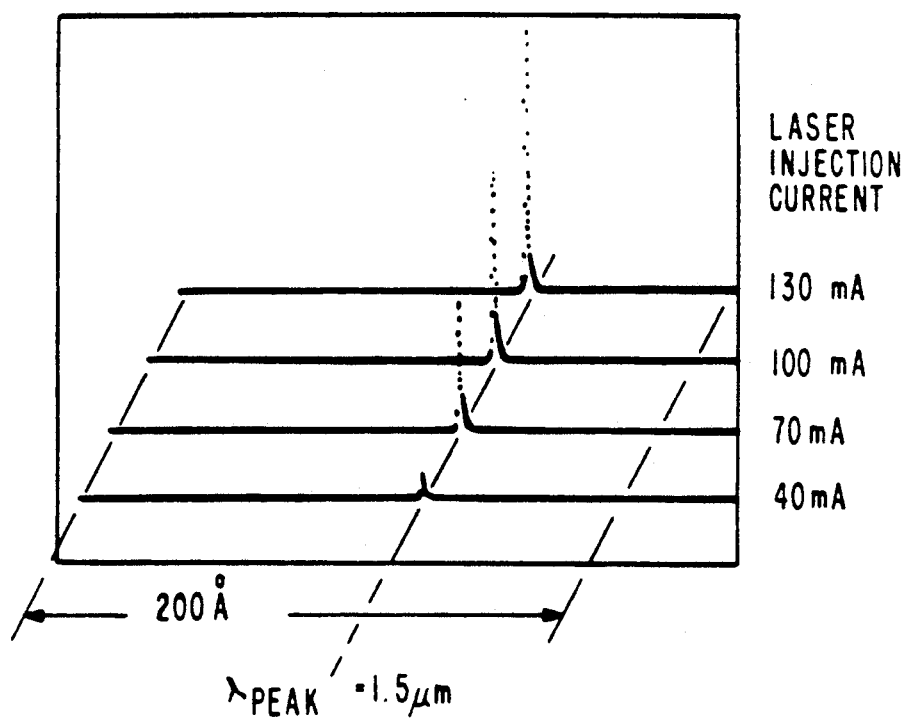
FIG. 13 shows a single longitudinal-mode spectra of the output of the device of FIG. 10.

Single DFB mode and fundamental transverse mode oscillation of the laser, Y-junction power coupling, and a high detector photocurrent were all demonstrated. FIG. 12 shows, for one PIC sample, the photocurrent of the integrated detector versus the laser injection current at 25° C. The output powers from both the laser side and the Y-branch output port of the PIC chip, measured with an external photodiode, are also shown as dashed lines in the figure. With cleaved facets on both ends, the total power from the Y-branch output side is close to one half of the output from the laser side for this sample. The detector photocurrent is about 150 μA/mW power from the Y-branch output port. FIG. 13 shows the observed single longitudinal mode output for injection currents from 35 mA, the laser threshold, to 130 mA with a 32 dB side mode suppression.

Figure 14:
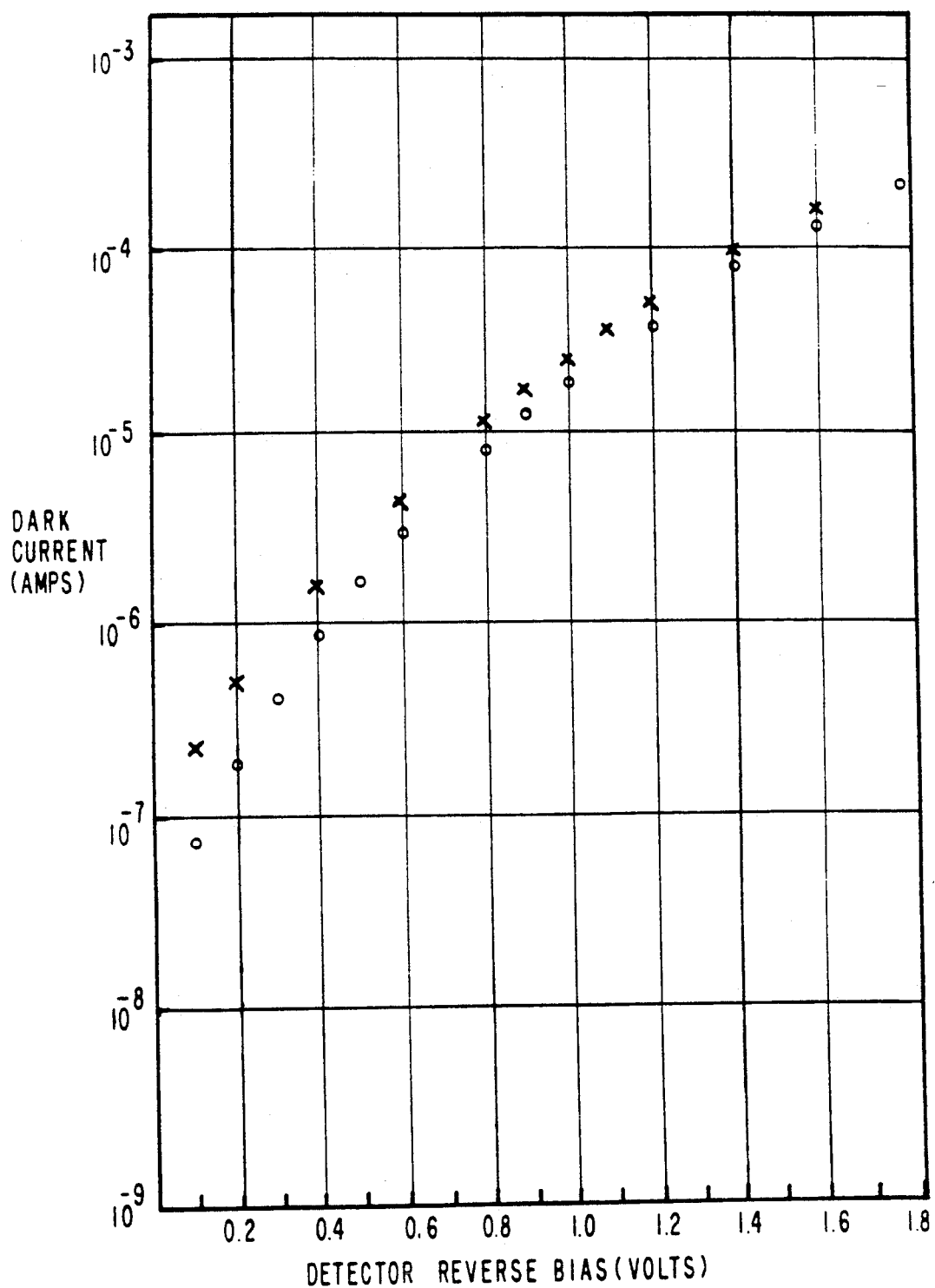
FIG. 14 shows the detector reverse dark currents at 22 degrees C. for two typical samples of the device of FIG. 10.

The electrical isolation between the laser and the detector of the finished chips is in the range of 1 MΩ to 10 MΩ. A good electrical isolation is important for an integrated detector, because the leakage current from the laser bias to the detector is added to the reverse dark current of the detector in the external circuit. With a typical 0.5 V turn-on voltage for a laser diode, the leakage current to the detector due to laser bias is less than 0.5 μA for isolation greater than 1 MΩ. The measured detector dark currents at 22° C. with the laser unbiased are plotted as a function of detector reverse voltage in FIG. 14 for two typical integrated detectors. Since a reverse bias is not necessary when the integrated detector is used to monitor the average laser output power, FIG. 14 shows that the dark current is negligible compared to the photocurrent.

To estimate the Y-branching loss and the detector efficiency, straight waveguides with an integrated DFB laser on one end and a detector on the other were fabricated on the same wafer with the Y-waveguide devices. The straight waveguide propagation loss is 3 db/cm, or 0.75 dB loss for the total length of the PIC chip. By comparing the photocurrents of the Y-waveguide and straight waveguide devices at a same output power from the laser facet side, the Y-branching loss can be estimated. Very similar photocurrents, 140 to 150 μA/mW power from the Y output port, were measured for all DFB-Y-Detector PIC samples.

In addition to the 3 dB branching loss, an excess Y-junction loss of about 3 dB was determined for the best samples. This excess loss is due to mode mismatch at the junction tip, the waveguiding bending loss, and scattering from the stepped wall of the waveguide bend, all of which can be reduced by improving the design of the waveguide mask. Since a sufficiently large monitoring photocurrent has been obtained, the Y-junction can be replaced in the future with a directional coupler with less than 3 dB power coupling to the detector. A low reflectivity coating on the output facet and a high reflectivity coating on the DFB laser side will also increase the waveguide output power for use in optical fiber transmission systems.

B. Discretely Tunable Two Section MQW DBR Lasers

Broadly tunable semiconductor lasers (Y. Kotaki, M. Matsuda, M. Yano, H. Ishikawa and H. Imai, Electron. Lett, 23, 327 (1987); S. Murata, I. Mito and K. Kobayashi, Electron. Lett. 23, 405 (1987); W. T. Tsang, N. A. Olsson, and R. A. Logan, Appl. Phys. Lett. 42, 650 (1987); and U. Koren, B. I. Miller, G. Eisenstein, R. S. Tucker, G. Raybon, R. J. Capik, Electron. Lett. 24, 138 (1988)) are expected to play a major role in both high-speed direct detection wavelength-division-multiplexed (WDM) systems and coherent heterodyne detection systems, and may also find applications in new optical switching architectures. In this section we describe the structure and performance of tunable single-longitudinal-mode InGaAs/InGaAsP multiple-quantum-well (MQW) distributed-Bragg-reflector (DBR) lasers operating at 1.5 μm which was fabricated using the inventive technique. These lasers display low threshold, excellent differential quantum efficiency, large tuning range, with both low chirp under high-speed direct modulation and narrow linewidth under CW operation.

Figure 15:
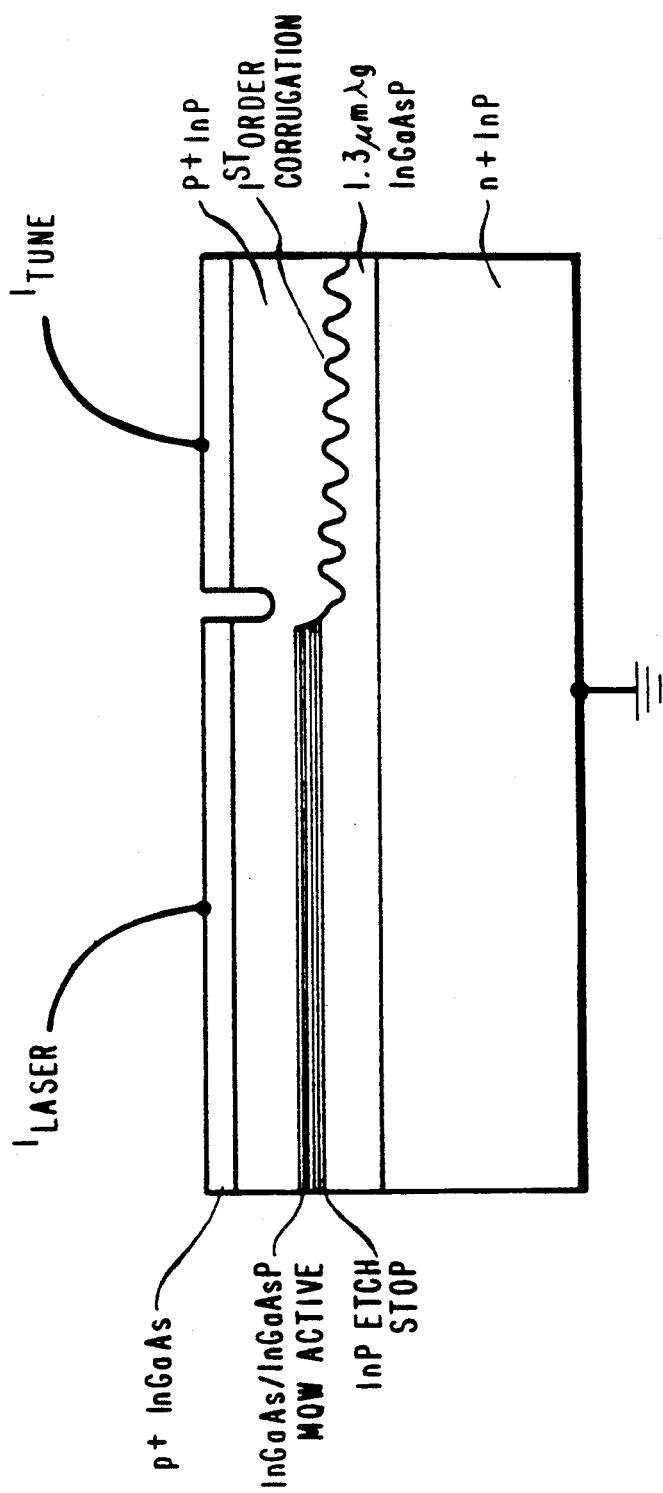
FIG. 15 shows the longitudinal structure of a tunable MQW SIPBH DBR laser fabricated using the inventive process.

The longitudinal cross section cut through the laser waveguide is shown in FIG. 15. These devices are grown entirely by atmospheric pressure metal organic chemical vapor deposition (MOCVD), and are based on the semi-insulating blocked planar buried heterostructure (SIPBH) geometry. (U. Koren, B. I. Miller, T. K. Su, T. L. Koch and J. E. Bowers, Appl. Phys. Lett. 51, 1744 (1987) The low capacitance resulting from the Fe-doped InP current blocking layers allows high-speed operation with wide contacting mesas about the active region.

The active (gain) layer in these devices consists of four 80 Å thick wells of InGaAs with 100 Å thick barriers of 1.3 μm $\lambda_{PL}$ (photoluminescence wavelength) InGaAsP. We have previously shown that 1.5 μm Fabry-Perot lasers based on this MQW sequence display low internal loss with excellent quantum efficiency and maximum power. (U. Koren, B. I. Miller, G. Eisenstein, R. S. Tucker, G. Raybon, R. J. Capik, Electron. Lett. 24, 138 (1988)).

In the DBR structure shown in FIG. 15, a 250 Å thick InP etch-stop layer and a 2500 Å thick passive 1.3 $\lambda_{PL}$ InGaAsP guide layer are place beneath the active MQW layers. The active layers are etched off in the guide region using a material selective InGaAs/InGaAsP etch, and a first order ~2350 Å pitch grating is formed with conventional holographic means on the exposed surface of the passive guide only. Typical Bragg region lengths are ~250 μm, and active lengths are in the range of 250 to 600 μm.

Figure 16:
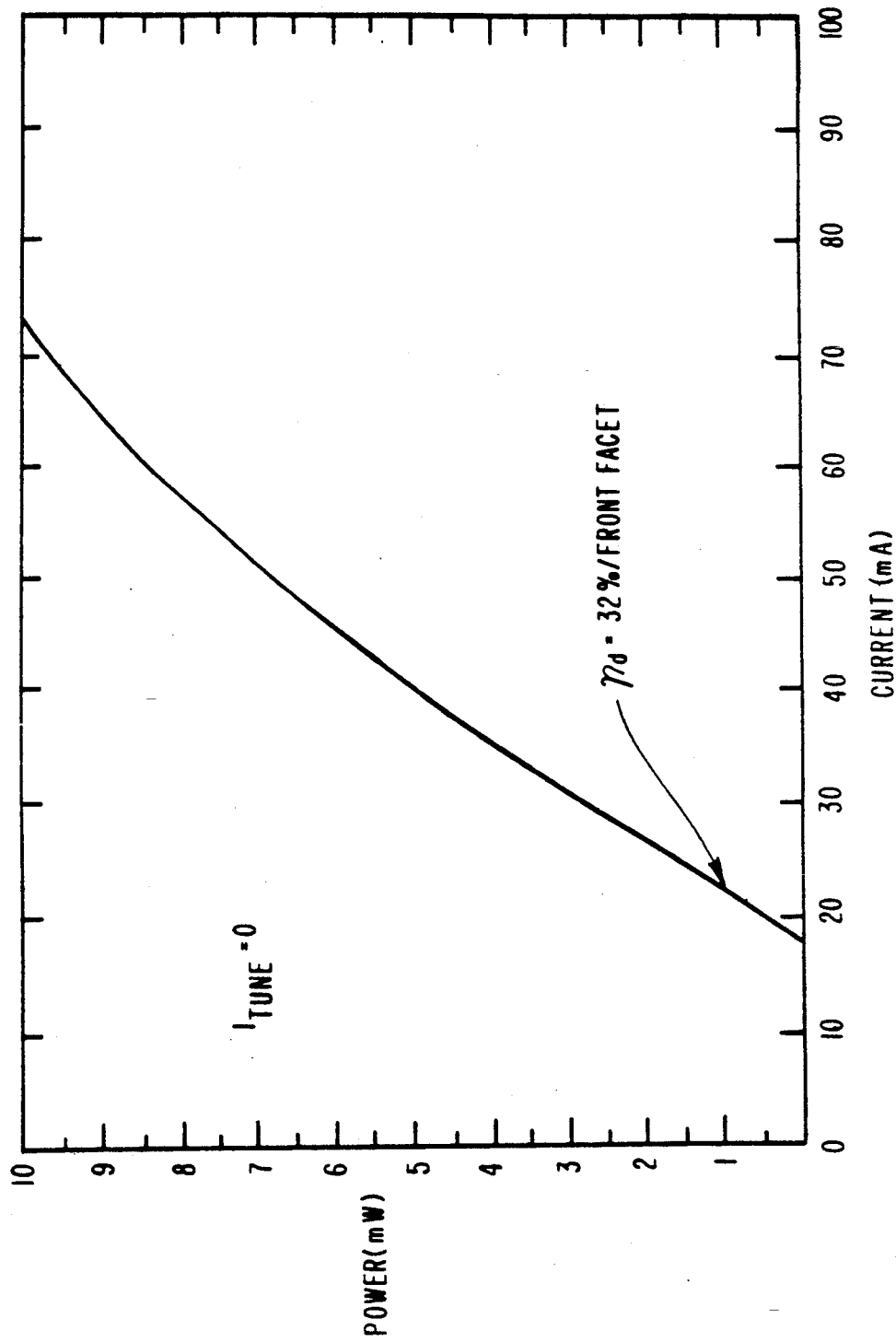
FIG. 16 is a CW light-current characteristic for a 300 micron active section length device as shown in FIG. 15 at 23 degrees C. with no current to the Bragg section.

FIG. 16 shows a CW 23° C. light-current characteristic of a 300 μm active length device with no current to the Bragg section. The differential efficiency is $\eta_d$=32%/front facet with no coatings applied, although some roll-over occurs at higher powers. This is the highest value we know of for DBR lasers and indicates very good coupling into the Bragg region. Typical thresholds are 17–20 mA, with excellent device yield and uniformity permitting 10 mW output below 100 mA drive in the vast majority of devices.

Figure 17:
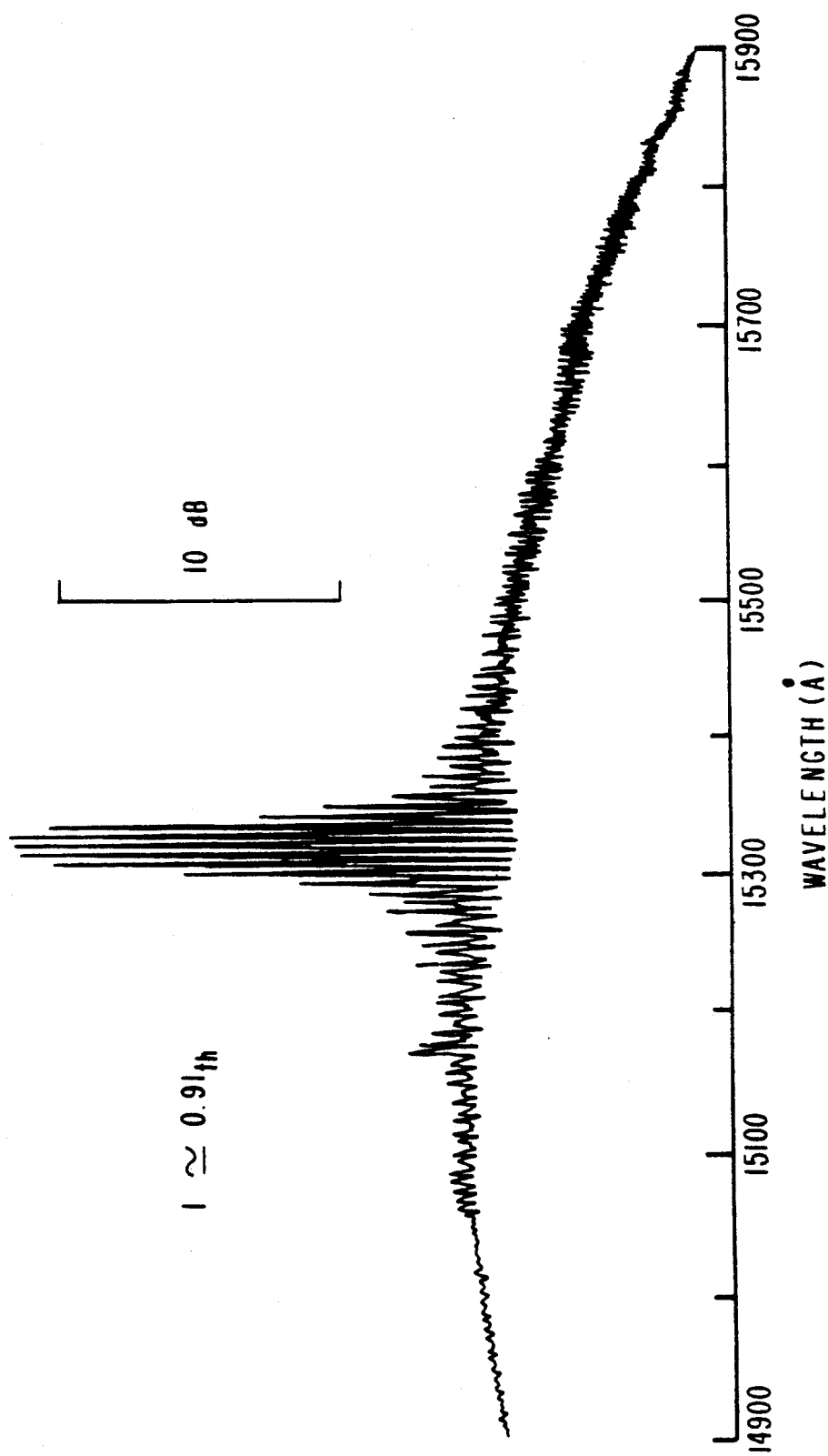
FIG. 17 is a logrithmic scale section of the device of FIG. 16 at $I=0.9\ I_{th}$. Above threshold devices operate single longitudinal mode with side mode suppression in excess of 30 dB.

FIG. 17 shows a typical below threshold (I~0.9 $I_{th}$) log-scale spectrum for the tunable MQW DBR laser. The spectral width of the Bragg region for this wafer is ~40 Å, corresponding to a coupling constant of κ~140 cm$^{-1}$ which is in reasonable agreement with the numerically evaluated value of $\kappa \sim 175$ cm$^{-1}$ based on the known layer indices and typical corrugation depths. Note that the spacing of the Fabry-Perot modes out of band is much closer than the Bragg band modes since the former correspond to the entire cavity length. When run above threshold, these devices operate in a single longitudinal mode with side-mode suppression as high as 45 dB at high power. Most devices remain in the same single longitudinal mode over the entire operating range, although as expected some devices switch to an adjacent longitudinal mode within the Bragg band as power is increased.

Figure 18:
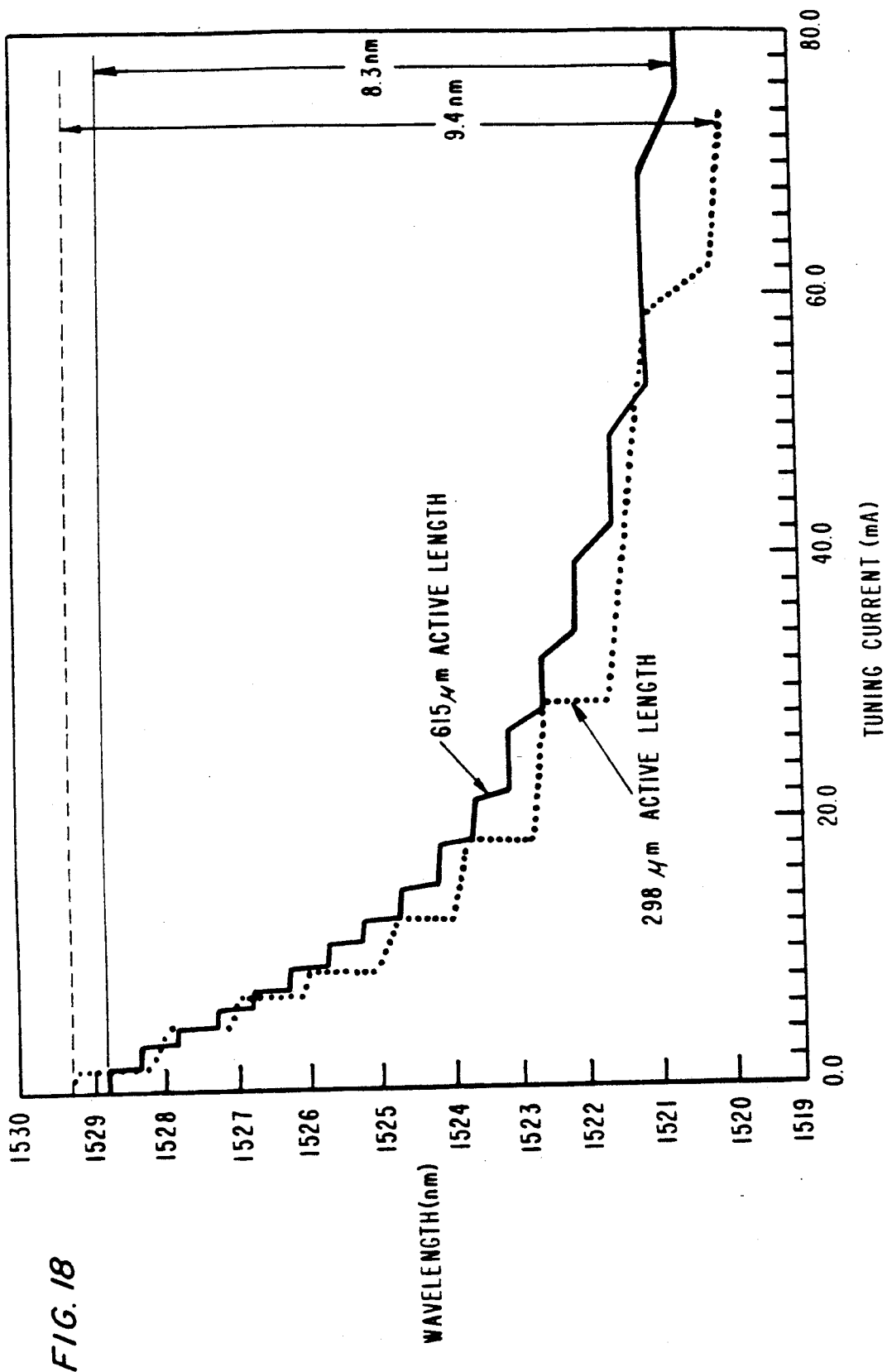
FIG. 18 is a diagram of the wavelength versus Bragg tuning current for two different active section length devices such as those shown in FIG. 15. For a strong grating device, continuous tuning between mode jumps is typically less than or equal to 20% of the mode jump spacing.

The tuning characteristics for these devices are shown in FIG. 18. Results for both a 615 μm and a 298 μm active length device are shown, and the maximum total tuning range obtained is 94 μ. The index change vs. current is the same in both cases, and with a typical Bragg section confinement factor of I~0.4 in the passive 1.3 μm $\lambda_{PL}$ guide layer, indicates a maximum index change under forward injection of ~1.5%. Since this device does not incorporate a separate phase tuning section, (Y. Kotaki, M. Matsuda, M. Yano, H. Ishikawa and H. Imai, Electron. Lett, 23, 327 (1987); S. Murata, I. Mito and K. Kobayashi, Electron. Lett. 23, 405 (1987)) the wavelength changes in discrete hops with a relatively small (~1-2 Å) continuous tuning between each hop. The longer device has seventeen successive longitudinal modes which are accessible, while the shorter device has nine. The hopping behavior is uniform and reproducible, and a small amount of temperature tuning allows access to all wavelengths throughout the tuning range.

Figure 19:
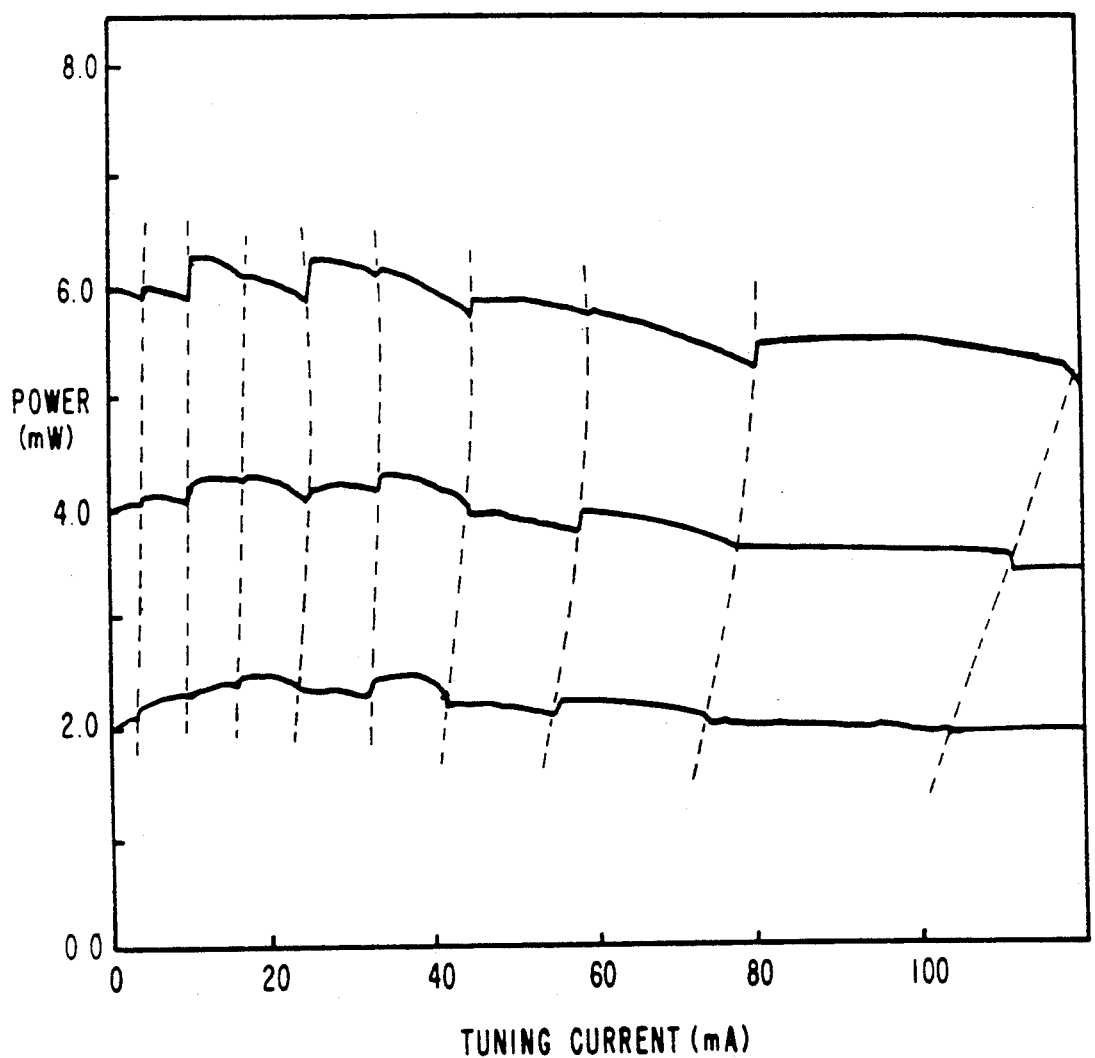
FIG. 19 is a diagram of the laser output power versus the tuning section current for the device of FIG. 15. The three curves in this figure are for three laser section bias current levels corresponding to power levels of 2, 4, and 6 mW for an open circuited tuning section. The dotted lines show the mode hopping boundaries as the tuning current is varied.

In wafers with strong gratings, there is little interplay between the tuning current and the laser output power. This is evident in FIG. 19, which shows the laser output power vs. tuning current for three different laser-section drive levels. The curves are quite flat except for the discontinuity seen at each mode-hopping point as the device is tuned. FIG. 19 also demonstrates that the various single-longitudinal-mode tuning current ranges are largely independent of the laser-section drive or output power. This manifests itself as the near-vertical mode-hopping boundaries as shown by the dotted lines in the figure.

A weak dependence of output power on tuning current will be obtained provided the loss $\gamma$ induced by forward current injection in the passive guide is less than the grating coupling constant, $\gamma \leq \kappa$, since reflection then occurs in lengths shorter than the absorption depth in the guide. For weaker gratings ($\kappa \sim 70$ cm$^{-1}$), we have observed as much as a 50% reduction in power at the short end of the tuning range. Based on this behavior, we estimate the ratio of real index change to imaginary index change under forward injection in the passive Bragg region to be in excess of 10. This indicates that forward current injection, apart from its bandwidth limitations, provides a reasonably high performance mechanism for tuning.

Figure 20:
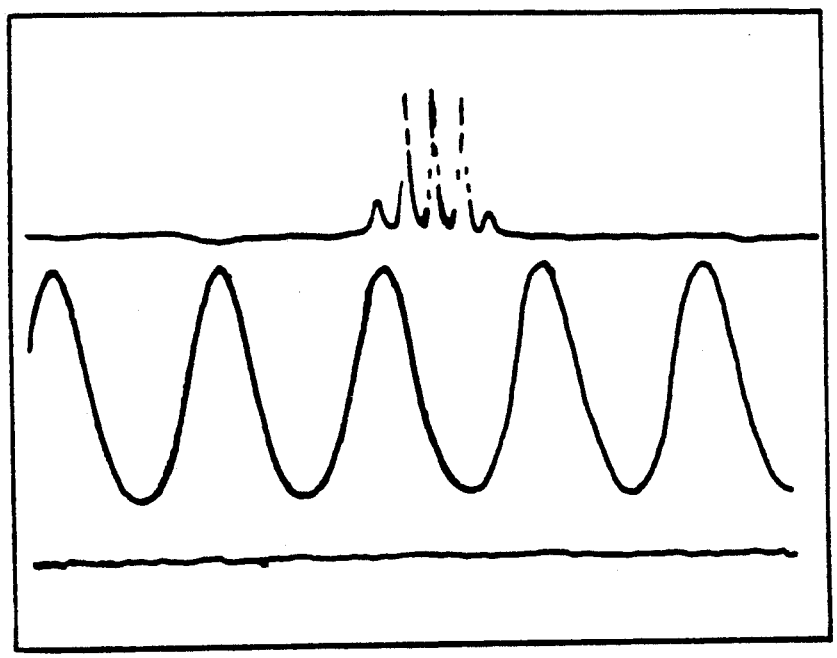
FIG. 20 is a measurement of the linewidth enhancement factor α. The upper trace shows the FM sideband spectrum which results from the intensity modulated wave form shown in the lower trace under 4.7 GHz sinusoidal current modulation. Numerical simulation indicates that this ratio of FM to IN indices corresponds to approximately −3.5.

At any particular current setting to the Bragg region, these devices provide excellent dynamic-single-mode high-speed sources. FIG. 20 shows a simultaneous measurement of the temporal intensity modulated (IM) waveform and the FM sideband spectrum of the single mode under 4.7 GHz sinusoidal modulation. At reasonably high frequencies, the ratio of FM and IM index provides a measure (Ch. Harder, K. Vahala and A. Yariv, Appl. Phys. Lett. 42, 328 (1983); and T. L. Koch and J. E. Bowers, Electron. Lett. 20, 1038 (1984)) of the linewidth enhancement factor $\alpha$, and FIG. 19 yields an unusually low value of $\alpha \sim -3.5$. We believe this low a value is partially due to the MQW active layer in these devices, but also due to detuning to wavelengths shorter than the gain peak. This is evident in FIG. 17, where the gain peak is the location of maximum Fabry-Perot fringe visibility. As expected, wafers detuned to the longer wavelength side of the gain peak displayed larger $\alpha$ values of $\sim -6$.

Figure 21:
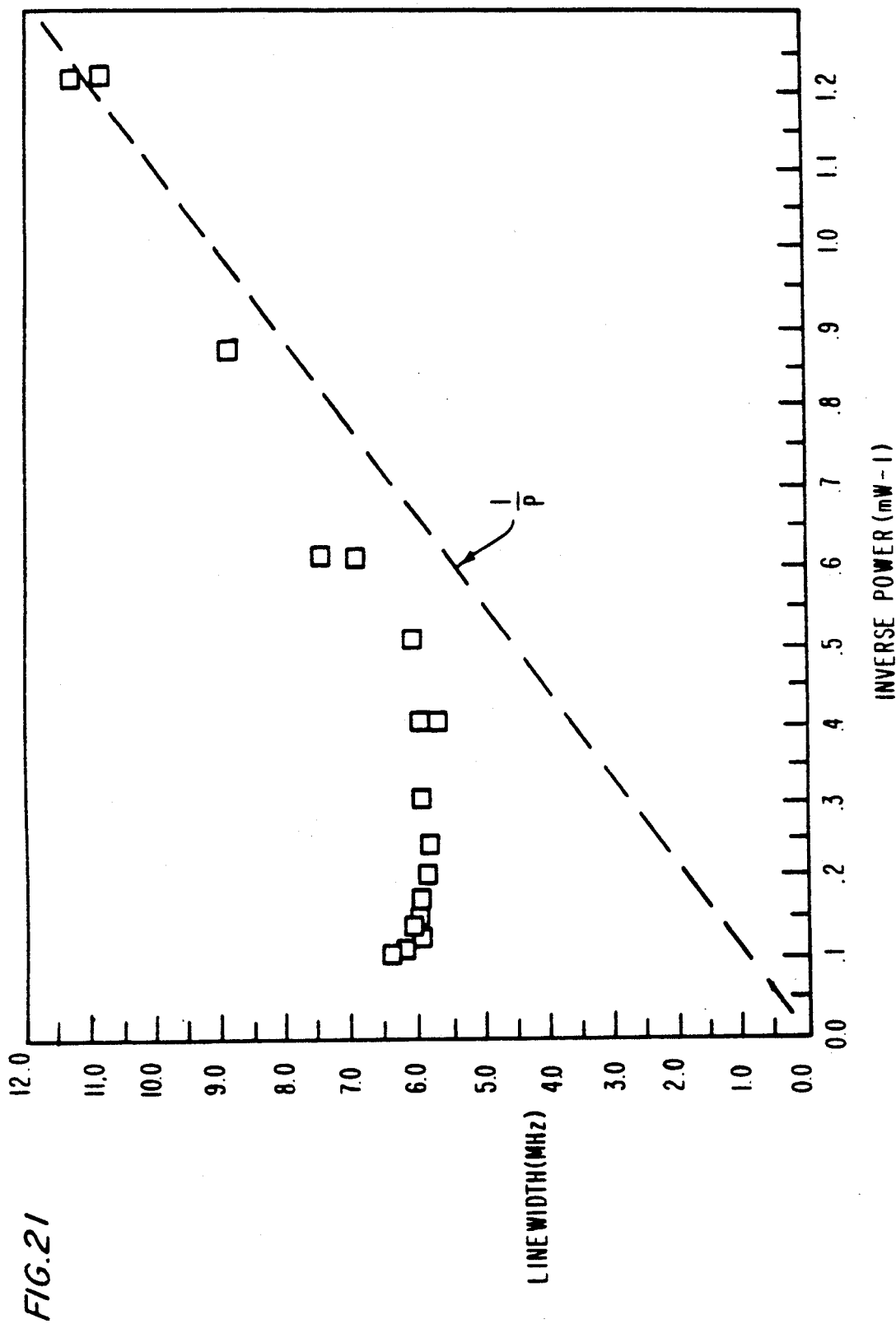
FIG. 21 is a diagram of the CW line width versus inverse output power for the device of FIG. 15 as measured by the delayed self-heterodyne method.

One consequence of a smaller a is low chirping under large signal digital modulation. We have measured a spectral width of only 1.4 Å at the $-20$ dB level under 5 Gb/s non-return-to zero modulation with 5:1 extinction. Another consequence of a smaller a factor is reduced phase noise. FIG. 21 shows the CW linewidth as measured by a delayed self-heterodyne apparatus plotted vs. the inverse optical power from the laser. At relatively low output powers ($\sim 2$ mW), the linewidth has reached a low value of $\sim 6$ MHz. This is qualitatively consistent with the $\alpha$ factor measured above. However, over the majority of the useful operating range of the laser the linewidth then remains constant, rather than decreasing with increasing optical power as expected.

C. Continuously Tunable Three Section MQW DBR Lasers

Figure 22:
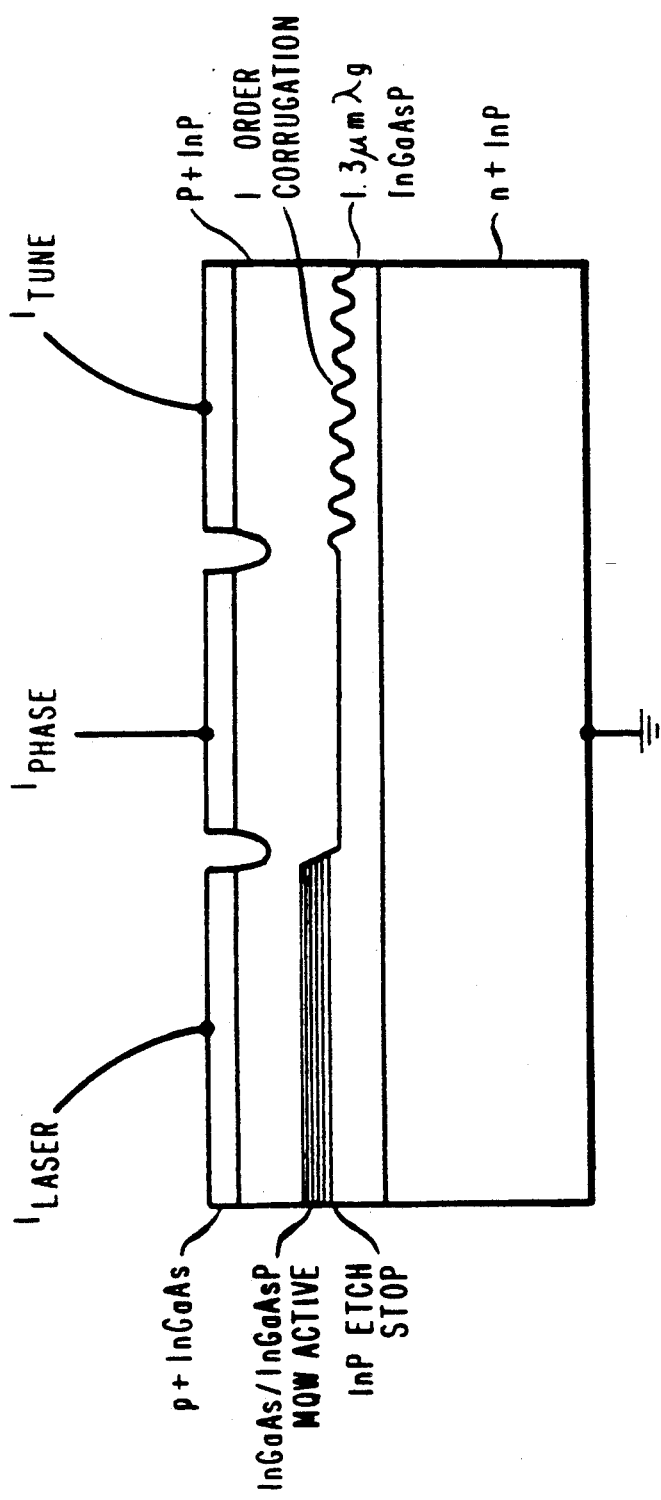
FIG. 22 is a schematic representation of the longitudinal structure of a three section continuously tunable MQW DBR laser fabricated using the inventive process.

This embodiment shown in FIG. 22 is a basic three-section, three-electrode, Distributed Bragg Reflector (DBR) laser design, (S. Murata, I. Mito and K. Kobayashi, Electron. Lett., 23, 403, 1987) where we have employed MQW active layers. (U. Koren, B. I. Miller, Y. K. Su, T. L. Koch and J. E. Bowers, Appl. Phys. Lett, 51, 1744, 1987) The detailed sequence in the gain section is: an n$^+$ InP substrate with an n$^+$ InP buffer, a ~2500 Å of n-type 1.3 μm $\lambda_{PL}$ (photoluminescence wavelength) Q (quaternary InGaAsP) serving as the majority of the waveguide core, a 250 Å n-type InP etch-stop layer, four sequences of 100 Å 1.3 $\lambda_{PL}$ Q barriers and 80 Å InGaAs quantum wells, ~500 Å p$^-$1.3 $\lambda_{PL}$ Q, and an upper 1.5 μm thick p$^+$ InP cladding with a ~0.5 μm p$^+$ InGaAs cap. The lateral structure is the previously described (U. Koren, B. I. Miller, G. Eisenstein, R. S. Tucker, G. Raybon, and R. J. Capik, Electron. Lett., 24, 138 1988) Semi-Insulating Planar Buried Heterostructure geometry, and all epitaxy is done with atmospheric pressure MOCVD. No optical coatings were applied to any of the devices studied here.

Figure 23:
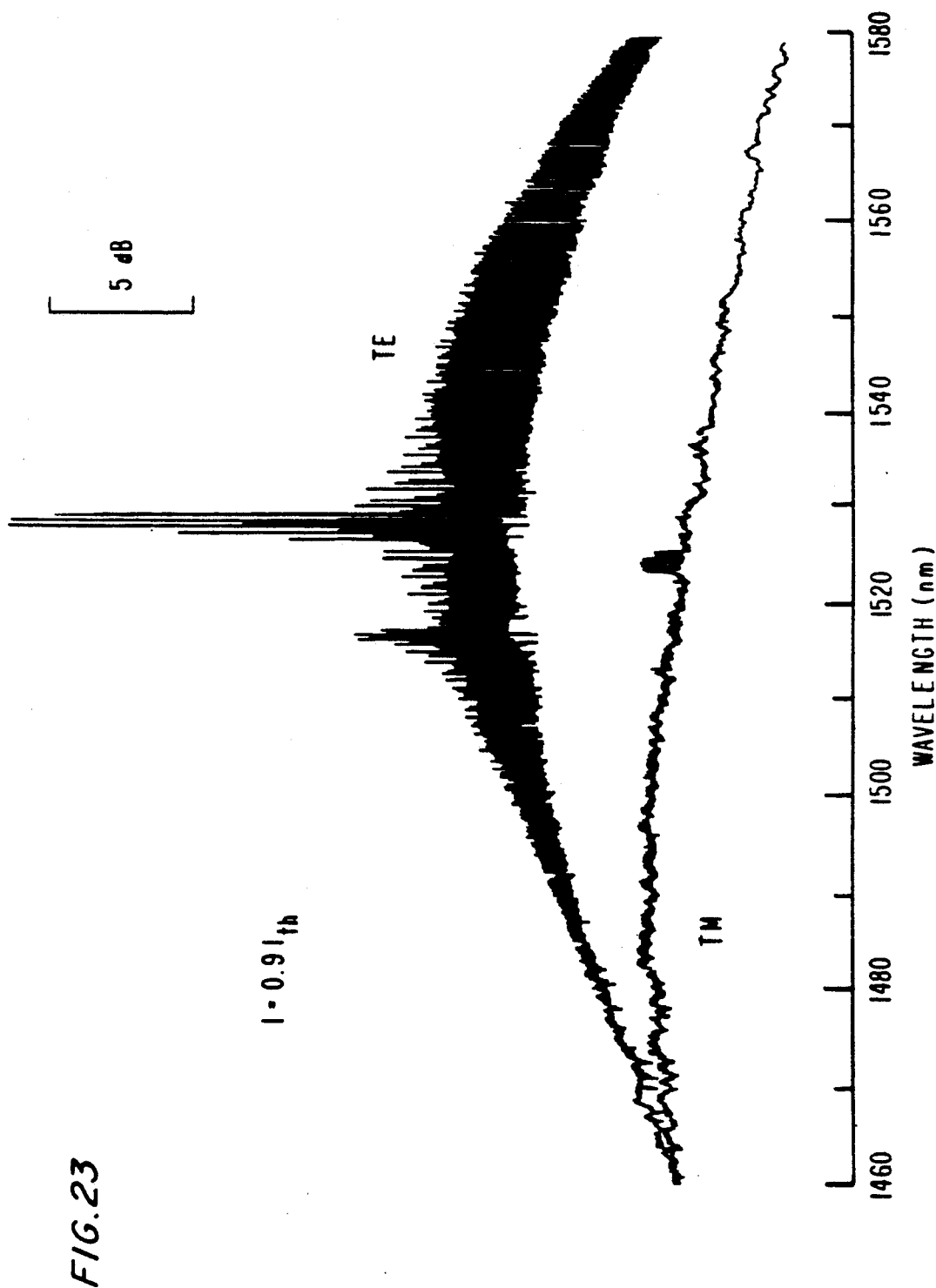
FIG. 23 is the below threshold logrithmic scale spectrum of TE and TM emission.

FIG. 23 shows a typical TE and TM optical spectrum of at 0.9 I$_{th}$ for devices with gain, phase, and Bragg section lengths of 400 μm, 60 μm, and 350 μm, respectively, and 20 μm isolation grooves between the sections. Well outside the Bragg band the finely spaced Fabry-Perot modes of the entire cavity evident in the TE emission have negligible ripple, indicating that the structure achieves the high level of optical continuity essential for reproducible, well behaved tuning characteristics. Side mode suppression above threshold can be as high as 45 dB, and easily exceeds 30 dB unless the Bragg or phase current is adjusted to be very near a mode transition. The TM emission is highly suppressed with its peak shifted to higher energy. This results from the reduced matrix element (M. Asada, A. Kameyama, Y. Suematsu, IEEE J. Quantum Electron., QE-20, 745-753, 1984) between the conduction band and the heavy-hole valence band near k$_\parallel$ =0. For direct modulation, this will drastically reduce any potential TM mode-partition problems.

Figure 24:
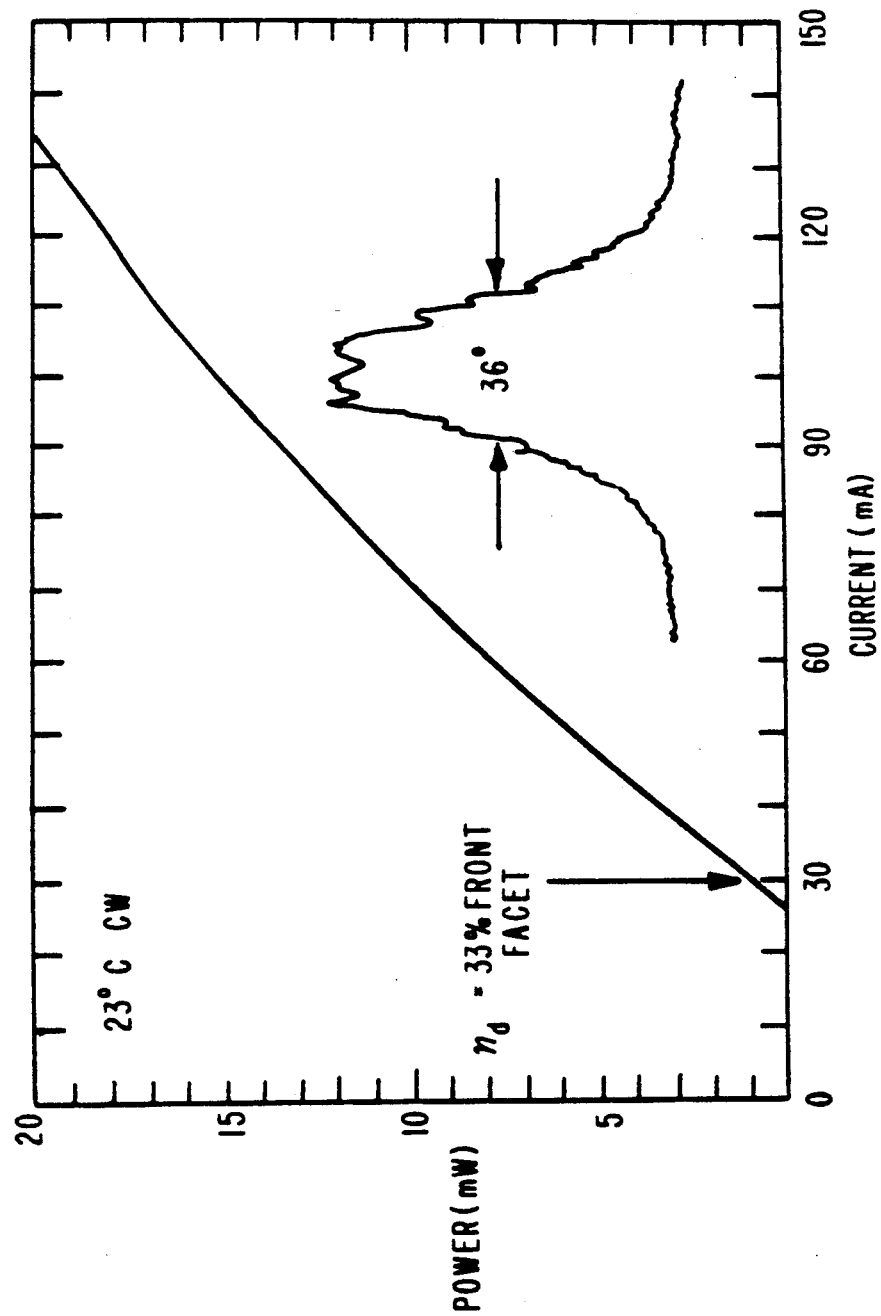
FIG. 24 is a light-current characteristic of the device of FIG. 22. The inset shows the stable far field.

The excellent optical continuity along the guide is also confirmed by the light-current (L-I) characteristics. FIG. 24 shows the CW 23° C. L-I curve for the device shown in FIG. 23, with the phase section open circuited and the Bragg section shorted through a 50 Ω resistance. The differential quantum efficiency $\eta_d$ at low power is 33%/front facet, indicating very low cavity loss. Output power exceeds 20 mW with no mode hop in this device; the inset shows the stable 36° FWHM far field. Maximum power and $\eta_d$ probably can be improved further with optimized output facet coatings.

Figure 25:
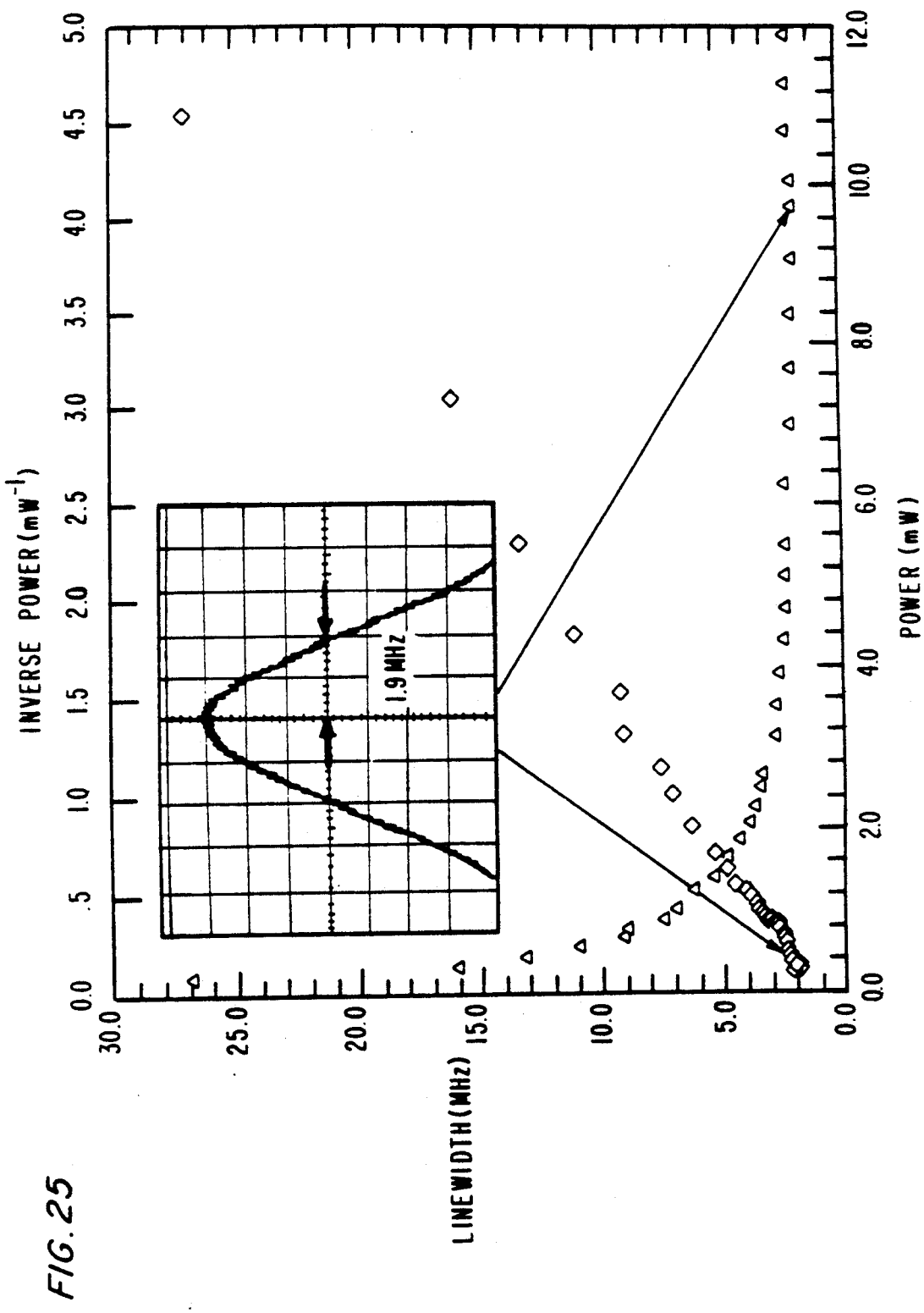
FIG. 25 is a diagram of the CW line width versus power (triangles) and inverse power (diamonds) as measured by the delayed self-heterodyne technique. The inset shows the beat spectrum revealing 1.9 MHz laser line width.

Linewidths which saturated at a minimum value of ~3–4 MHz were achievable in most devices measured. FIG. 25 shows the best device, with a minimum linewidth of 1.9 MHz as seen in the delayed self-heterodyne beat spectrum shown in the inset. The linewidth is plotted both vs. power and inverse power, and the linewidth-power product of 7 MHz.mW is very low for a single cavity semiconductor laser.

Figure 26:
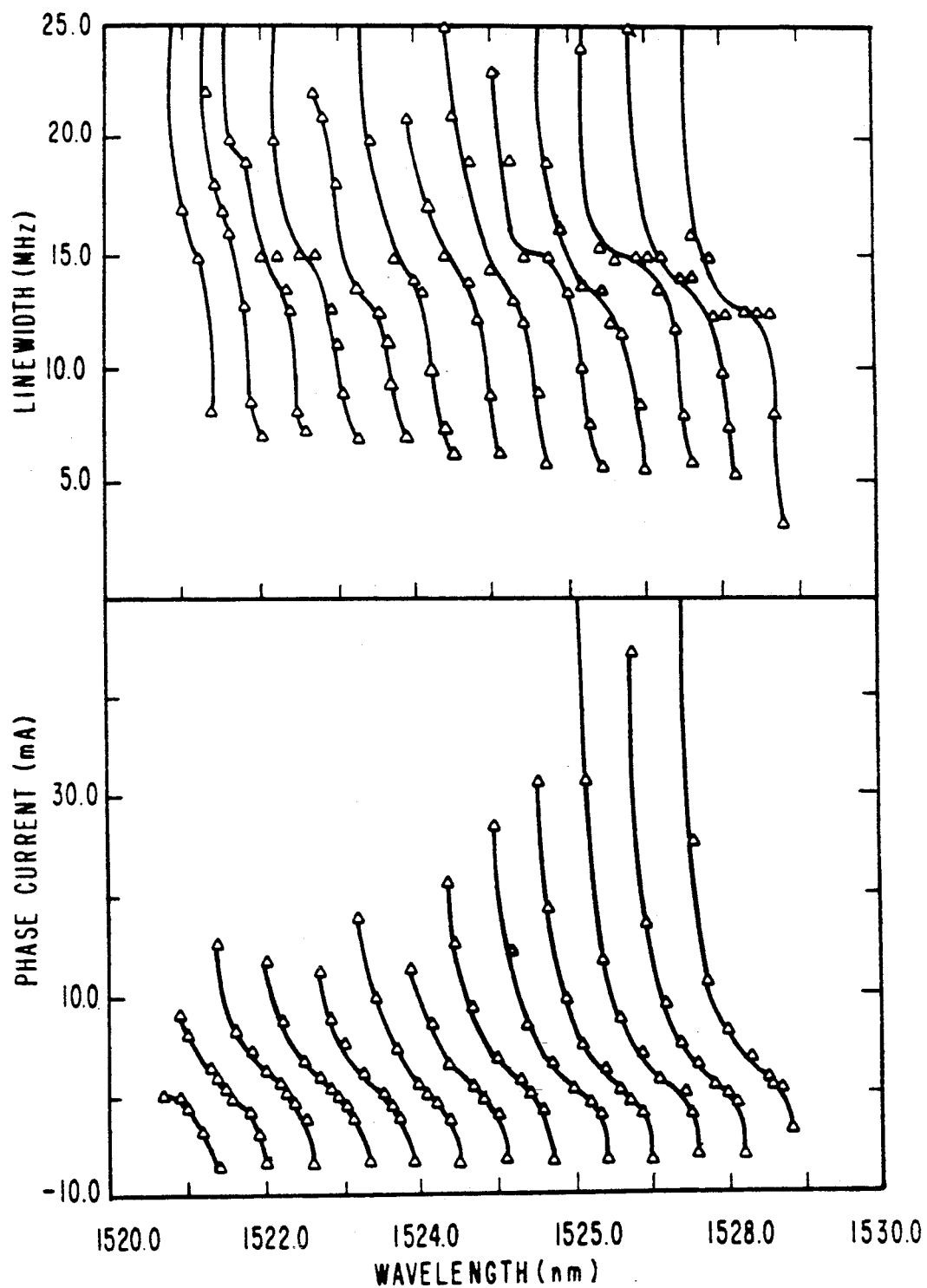
FIG. 26 shows the tuning characteristics of the device of FIG. 22. The bottom part of the figure shows the phase current required to achieve the specified wavelength for each of 13 different Bragg selectable modes. The Bragg current is also varied slightly along each trace to maximize the sweep range of each mode. The upper curves in this figure show the CW line width for each mode as tuning occurs. The entire 100 GHz range can be span while keeping line width below approximately 16 MHz.

FIG. 26 shows a typical tuning characteristic for these devices. The lower set of curves shows the phase-section current required to achieve the operating wavelength read along the abscissa for each of the 13 selectable longitudinal modes of the structure. Across the entire range the Bragg currents run from −1 mA to ~90 mA. Each curve has a different initial Bragg current for mode selection, but in addition the Bragg current is varied with the phase current a small amount along each curve to maximize the total sweep range of each mode. For the short (60 mm) phase section device shown here, the total tuning range exceeds 1000 GHz (~80 Å) and the sweep range is ~150 GHz (~14 Å). This exceeds the ~6 Å free spectral range by more than a factor of two, thus easily providing a guarantee of continuous electronic accessibility of any wavelength throughout the 1000 GHz range. This continuous sweeping range can usually be accomplished with only one current variation and a linear resistive current divider[1]. Longer (~234 Mm) phase section devices had similar characteristics with a slight reduction in $\eta_d$, but offered a larger local sweep of 250 GHz (~21 Å).

The upper part of FIG. 26 shows the linewidth behavior as the device is tuned. Provided one only scans an amount sufficient to achieve complete electronic coverage (one free spectral range), linewidths can always be maintained below ~16 MHz across the entire 1000 GHz tuning range. Reduced linewidth results from both the high Q cavity and the reduced linewidth enhancement factor $\alpha$ in the quantum-well gain medium. The latter was determined to have a value of ~−4.5 by monitoring simultaneously the FM sideband spectrum and the IM waveform under high speed direct modulation. (Ch. Harder, K. Vahala and A. Yariv, Appl. Phys. Lett., 42, 328, 1983)

These devices are suitable for both high quality tunable local oscillators or medium-bit-rate FSK transmitters. Flat FM response can be obtained up to the ~100 MHz limit imposed by the free carrier lifetime, with the large response (~10–15 GHz/mA) evident in FIG. 5 overpowering any thermal effects at low frequencies. Direct modulation is also possible, but any speed benefits resulting from increased quantum-well differential gain are overshadowed by the longer photon lifetime and reduced photon density due to the placement of the quantum wells with respect to the waveguide core. Linear variation of the relaxation oscillation frequency $f_{RO}$ vs. $P^{\frac{1}{2}}$ was observed, but even at powers of 18 mW, $f_{RO}$ had only achieved ~6 GHz. The devices do exhibit low chirp (1.8 Å 20 dB down) under 5 Gb/s direct modulation with a 3:1 extinction ratio; at higher extinctions the the high-Q-enhanced relaxation oscillations induce pattern effects and eye closure. Higher extinction would probably be possible with a front facet coating.

D. A Low Loss Long Cavity Semiconductor Laser

Figure 27:
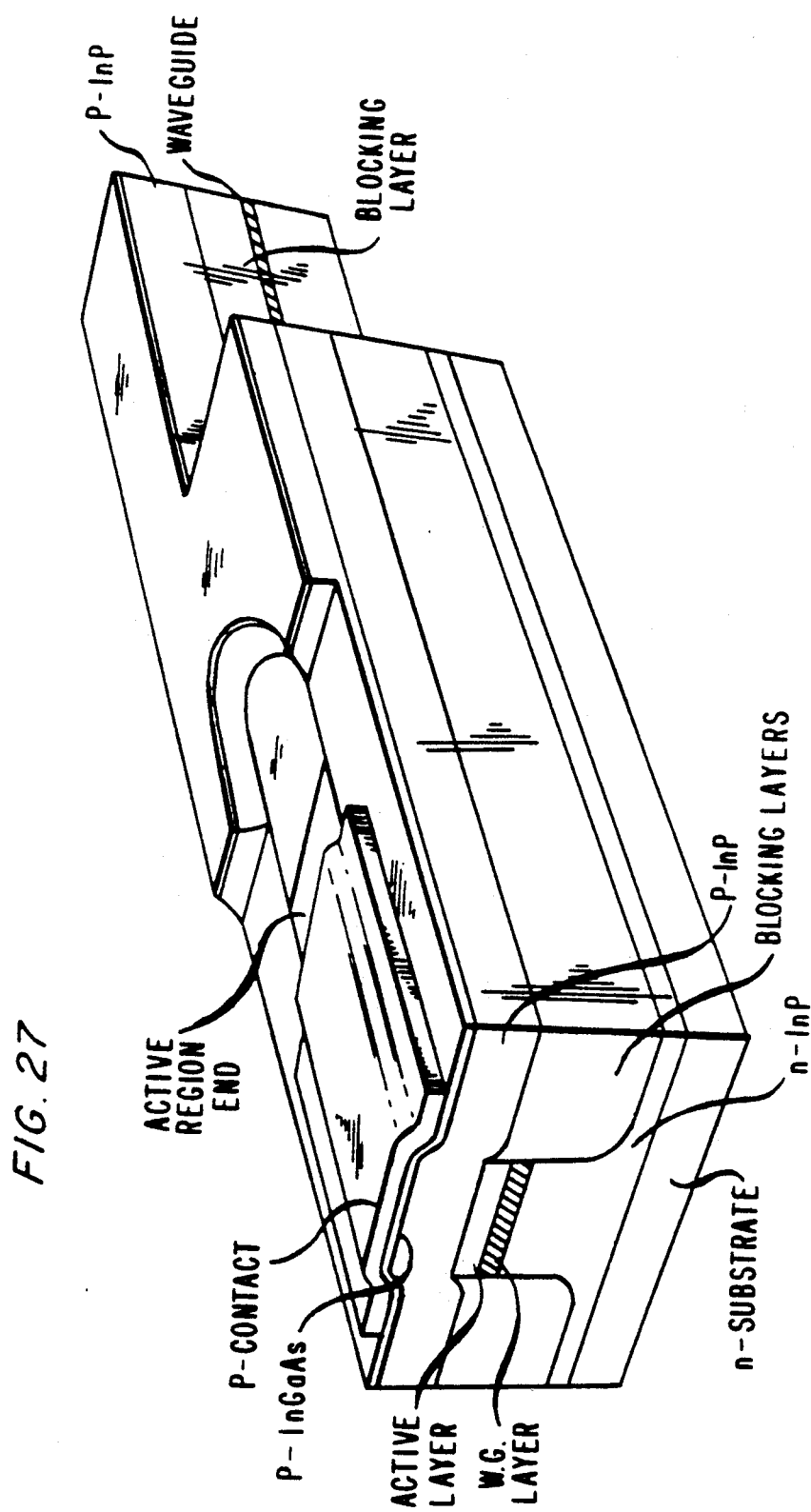
FIG. 27 is a schematic representation of a perspective view of a two section long cavity lasers made using the inventive process.

FIG. 27 shows schematic views of a long cavity laser with an intracavity passive waveguide fabricated using the inventive processing technique. Note the sequence of transitions along the longitudinal waveguide direction in this device. Going from left to right in FIG. 27, first the contact pad ends, then the active layer ends, then the deep etch region ends, then the $SiO_2$ regions ends. This is the recommended sequence, with longitudinal distances of typically 10 microns between transitions.

Figure 28:
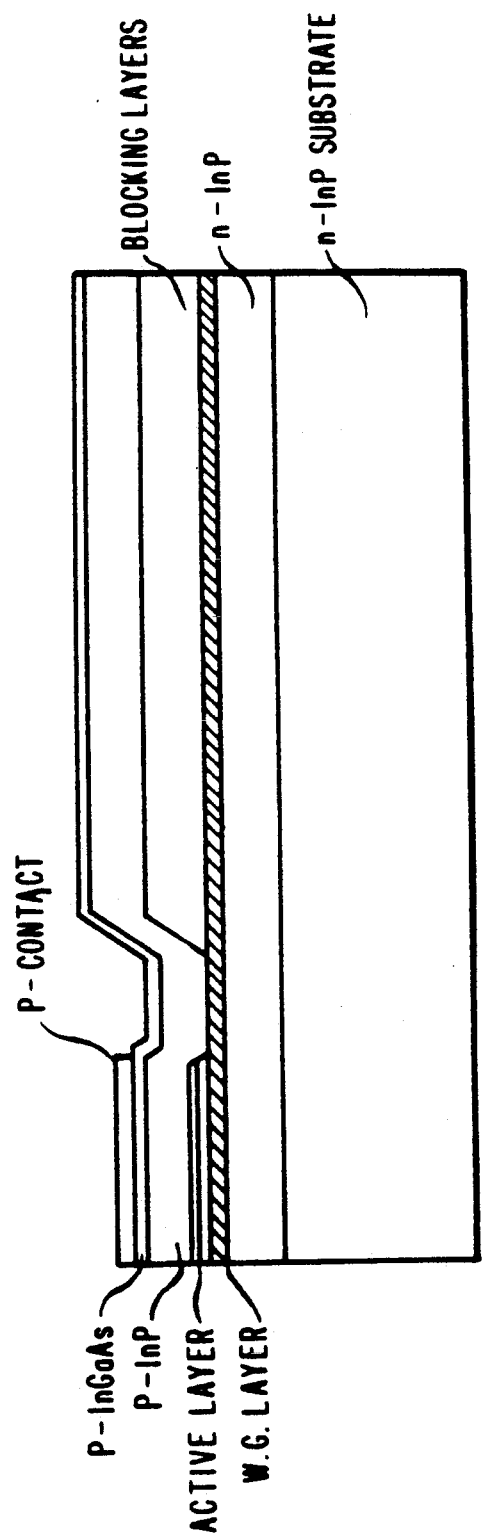
FIG. 28 is a schematic representation of the longitudinal cross section of the device of FIG. 27.

A typical L-I curve for this laser with 2.5 mm total cavity length is shown in FIG. 28. Note that these characteristics are not significantly different from those of a conventional cavity laser at 1.5 micron wavelength. Such high performance for an integrated long cavity laser has not been previously demonstrated.

E. A Passive Waveguide Star Coupler

Figure 29:
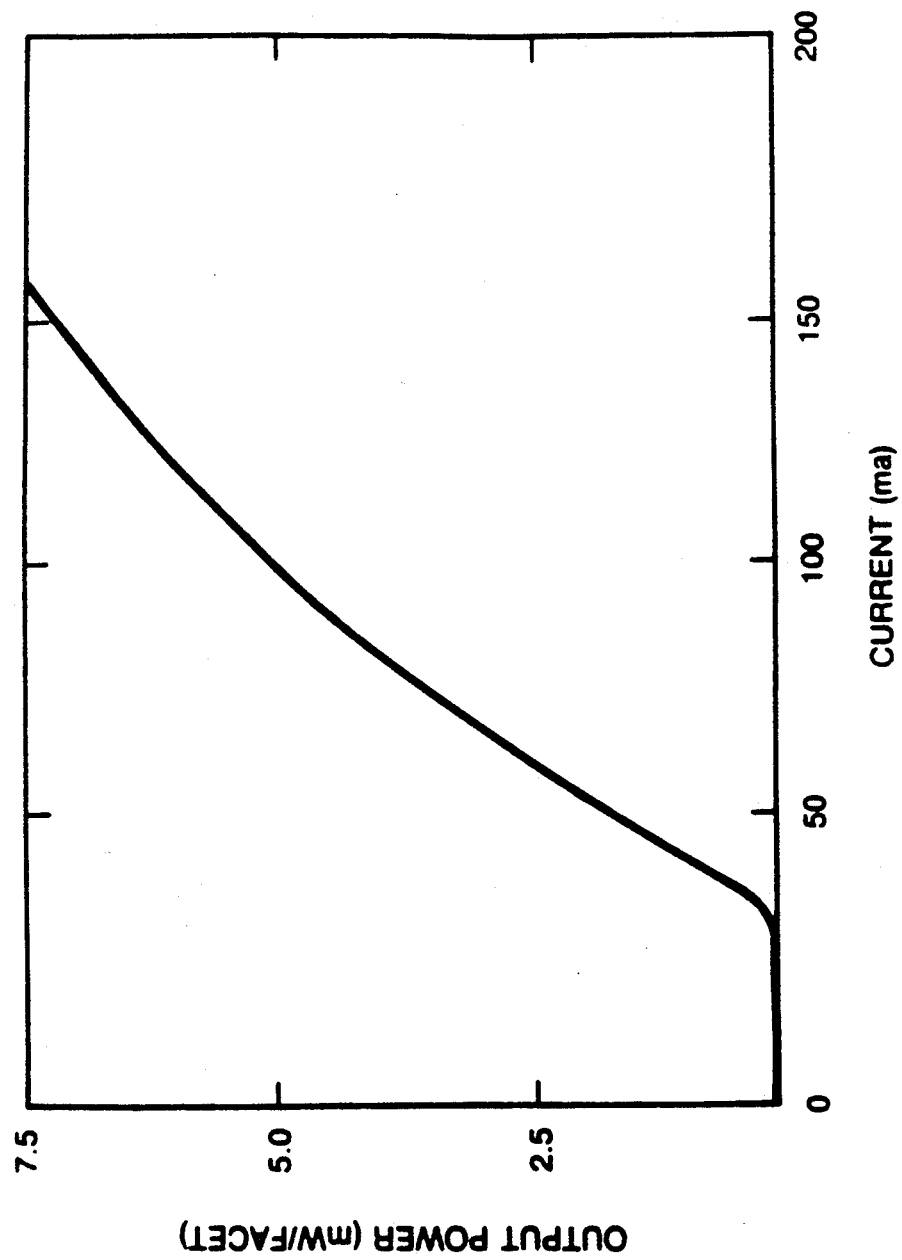
FIG. 29 is a representation of the light current characteristics of the device of FIG. 27 at a wavelength of 1.5 microns.
Figure 30:
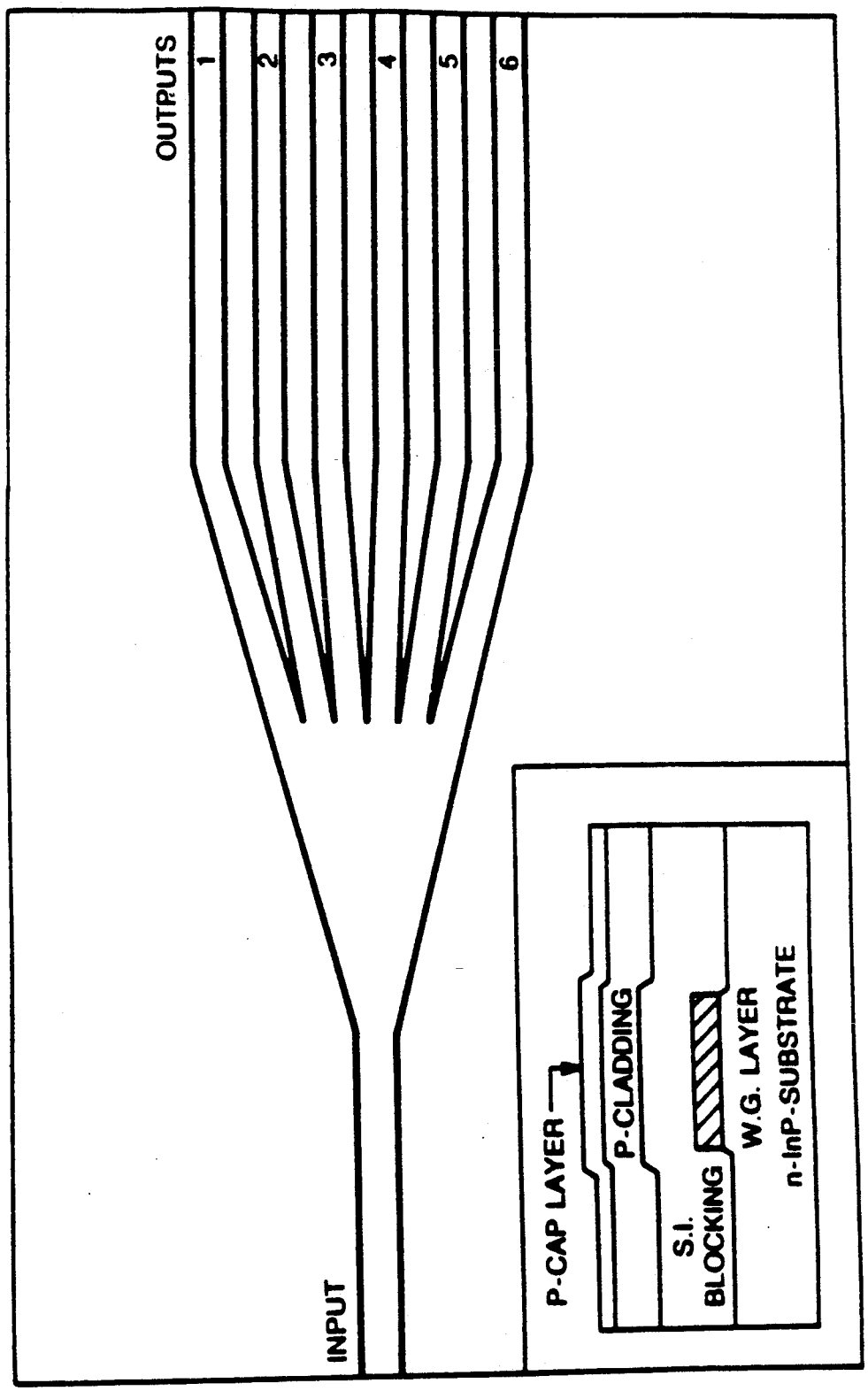
FIG. 30 is a schematic representation of a passive waveguide star coupler fabricated using the inventive process.

Another simple device made with the inventive process is a passive waveguide star coupler. A schematic diagram is shown in FIG. 29. The total insertion loss for this device distributing light from the single input to 8 different outputs was 11.5 dB. Input/output coupling loss is estimated at 8–10 dB and the additional loss results from internal coupling, bending and propagation loss. The propagation loss of the straight passive waveguides are in the range of 3–4 dB/cm. This was measured by measuring insertion losses for guide sections with different lengths.

What is claimed is:

1. A method of fabricating at least one photonic integrated circuit comprising
   epitaxially growing a stack of numerous layers of semiconductor materials, at least two of which differ in either material composition or doping level or doping type, at least a portion of each of the material layers serving a function in at least one of the devices which will comprise the photonic integrated circuit or in at least one of the photonic integrated circuit fabrication steps,
   THE INVENTION CHARACTERIZED IN THAT
   (1) the stack is selectively etched to define areas of specific layer combinations, at least a portion of some of such areas ultimately forming devices which will comprise the photonic integrated circuit, the specific layer combination of each such areas being appropriate for each of such devices,
   (2) a first, stripe geometry, mask is subsequently deposited to protect the region of the remaining stack underlying the mask from subsequent etching,
   (3) unmasked portions of the stack are subsequently etched,
   (4) a second mask, at least a portion of which overlies the first mask, and at least a portion of the overlying region of said overlying mask having a width larger than that of the first, stripe geometry, mask, is subsequently deposited to protect the region of the remaining stack underlying either the first or second mask from subsequent etching, (5) unmasked portions of the stack are subsequently etched, whereby portions of the stack which underlie only the second mask are less deeply etched than portions of the stack which do not underlie either of the masks, and a stripe geometry mesa is thereby formed with regions of deep and shallow sidewalls, (6) growing additional epitaxial materials which serve as current blocking layers in regions adjacent to those regions which ultimately form devices to which electric fields are applied, and said same additional epitaxial materials serve as cladding layers in regions which ultimately form optical waveguides.

2. The method of claim 1 wherein subsequently grown epitaxial material comprises semi-insulating materials.

3. The method of claim 2 wherein doped semiconductor material is subsequently epitaxially grown over said additional epitaxial materials.

4. The method of claim 1 wherein regions which will ultimately form devices to which electric fields will be applied are masked prior to growth of said additional epitaxial materials so as to avoid growth of said additional epitaxial materials over said regions which will ultimately form devices to which electric fields will be applied.

5. The method of claim 4 wherein said mask is removed and doped semiconductor material is subsequently epitaxially grown over said unmasked regions to provide electrical contact to said regions which will ultimately form devices to which electric fields will be applied.

* * * * *